US010714373B2

(12) United States Patent
Anada et al.

(10) Patent No.: US 10,714,373 B2
(45) Date of Patent: Jul. 14, 2020

(54) ELECTROSTATIC CHUCK AND WAFER PROCESSING APPARATUS

(71) Applicant: TOTO LTD., Kitakyushu-shi, Fukuoka (JP)

(72) Inventors: Kazuki Anada, Kitakyushu (JP); Yuichi Yoshii, Kitakyushu (JP); Takuma Wada, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 458 days.

(21) Appl. No.: 15/788,132

(22) Filed: Oct. 19, 2017

(65) Prior Publication Data

US 2018/0040499 A1 Feb. 8, 2018

Related U.S. Application Data

(63) Continuation of application No. PCT/JP2015/062905, filed on Apr. 28, 2015.

(30) Foreign Application Priority Data

Apr. 21, 2015 (JP) ................. 2015-086807

(51) Int. Cl.
| | | |
|---|---|---|
| *H01L 21/683* | (2006.01) | |
| *H01L 21/687* | (2006.01) | |
| *H01L 21/67* | (2006.01) | |

(52) U.S. Cl.
CPC .... *H01L 21/6833* (2013.01); *H01L 21/67109* (2013.01); *H01L 21/6831* (2013.01); *H01L 21/68735* (2013.01); *H01L 21/67103* (2013.01)

(58) Field of Classification Search
CPC ......... H01L 21/67103; H01L 21/67109; H01L 21/6831; H01L 21/6833; H01L 21/68735
USPC .......................................... 361/234
See application file for complete search history.

(56) References Cited

U.S. PATENT DOCUMENTS

| | | |
|---|---|---|
| 6,992,876 B1 | 1/2006 | Nakajima et al. |
| 2006/0209490 A1 | 9/2006 | Nakamura et al. |
| 2014/0063681 A1* | 3/2014 | Anada ............... H01L 21/68757 361/234 |

FOREIGN PATENT DOCUMENTS

JP 2004282047 A * 10/2004

OTHER PUBLICATIONS

Machine Translation of Nakamura Japanese Patent Document JP 2004-282047 A Oct. 2004 (Year: 2004).*

* cited by examiner

*Primary Examiner* — Kevin J Comber
(74) *Attorney, Agent, or Firm* — Carrier Blackman & Associates, P.C.; Joseph P. Carrier; William D. Blackman

(57) ABSTRACT

According to one embodiment, an electrostatic chuck includes a ceramic dielectric substrate including a sealing ring provided at a peripheral edge portion of the ceramic dielectric substrate, and an electrode layer including a plurality of electrode components. An outer perimeter of the ceramic dielectric substrate is provided to cause a spacing between the outer perimeter of the ceramic dielectric substrate and an outer perimeter of the electrode layer to be uniform. The spacing between the outer perimeter of the electrode layer and the outer perimeter of the ceramic dielectric substrate is narrower than a spacing of the electrode components. A width of the sealing ring is not less than 0.3 millimeters and not more than 3 millimeters. A width where the electrode layer overlaps the sealing ring is not less than −0.7 millimeters and not more than 2 millimeters.

15 Claims, 21 Drawing Sheets

ELECTROSTATIC CHUCK AND WAFER PROCESSING APPARATUS

CROSS-REFERENCE TO RELATED APPLICATIONS

This is a continuation application of International Application PCT/JP2015/062905, filed on Apr. 28, 2015. This application also claims priority to Japanese Application No. 2015-086807, filed on Apr. 21, 2015; the entire contents of each are incorporated herein by reference.

FIELD OF THE INVENTION

Embodiments described herein relate generally to an electrostatic chuck and a wafer processing apparatus, specifically to an electrostatic chuck and a wafer processing apparatus in which a chucked processing object can be maintained at a desired temperature.

BACKGROUND OF THE INVENTION

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc.

The electrostatic chuck is made by interposing an electrode between a ceramic base material such as alumina, etc., and by sintering. The electrostatic chuck applies electrical power for electrostatic attraction to the built-in electrode and attracts and holds the substrate such as the silicon wafer, etc., by an electrostatic force. A wafer processing apparatus includes such an electrostatic chuck.

In recent years, the plasma output in etching apparatuses that use plasma has been increasing. As the plasma output increases, the temperature of the wafer increases; and wafer temperature fluctuation is one cause of the decrease of process yields.

Conventionally, plasma has been used to clean the interior of the chamber regularly to remove residue and products adhered to the chamber inner surfaces. At this time, so-called waferless plasma cleaning may be performed in which processing of the surface of the electrostatic chuck is performed without covering the surface with a dummy wafer. When cleaning using waferless plasma cleaning, the surface of the electrostatic chuck is exposed directly to the cleaning plasma such as $O_2$ gas, $CF_4$ gas, etc.

Under such conditions, it is desirable for the electrostatic chuck to have plasma resistance, a high insulation breakdown voltage, and a long life.

However, for example, among electrostatic chucks, the chucking force is generated only on the electrode in a Coulomb-type electrostatic chuck. Accordingly, by providing the electrode at the lower portion of a sealing ring mounted at the outermost perimeter of the electrostatic chuck surface, the chucking force of the sealing ring portion increases; and highly efficient wafer cooling is possible. It is desirable for the electrode to have a configuration that is nearly a perfect circle to generate a uniform chucking force at the sealing ring portion and provide a uniform wafer temperature. For example, in the case where the configuration of the electrode is an ellipse, the electrode surface area of the minor axis portion of the ellipse is narrower than the electrode surface area of the major axis portion of the ellipse; therefore, the chucking force at the minor axis portion is lower than the chucking force at the major axis portion; the chucking force for attracting and holding the wafer is nonuniform in the surface; and the wafer cannot be cooled uniformly. Therefore, it is desirable for the electrode to be disposed uniformly up to the vicinity of the outer perimeter of the ceramic dielectric substrate. If the electrode is disposed uniformly up to the vicinity of the outer perimeter of the ceramic dielectric substrate, a uniform chucking force can be obtained in a wide area of the wafer; and the temperature distribution of the wafer can be set to be uniform. However, in the case where the electrode is disposed up to the vicinity of the outer perimeter of the ceramic dielectric substrate, the insulating distance between the electrode of the ceramic dielectric substrate and the wafer which is the chucking object becomes short. Therefore, for example, when the configuration of the electrode is an ellipse, the insulating distance between the wafer and the electrode on the major axis side is shorter than the insulating distance between the wafer and the electrode on the minor axis side; therefore, there is a risk that the insulation breakdown voltage of the electrostatic chuck may undesirably decrease.

In JP-A 2003-504871 (Kohyo), a configuration is discussed in which an electrode extends on the outer side of a groove of a cooling gas in a Johnsen-Rahbek electrostatic chuck. However, because the electrode is provided in the interior of the ceramic dielectric substrate, it is difficult to easily and accurately detect the position of the electrode from outside the ceramic dielectric substrate. For example, it is necessary to perform the measurement using an ultrasonic flaw detector, etc., to ascertain the position of the electrode provided in the interior of the ceramic dielectric substrate; but the measurement accuracy of the ultrasonic flaw detector is, for example, about 0.5 millimeters (mm). Therefore, it is difficult to identify dimensions less than 0.5 mm when measuring using the ultrasonic flaw detector.

Also, because the position of the electrode after the sintering of the ceramic dielectric substrate is different according to the conditions when sintering such as the electrode outer diameter, the shrinkage factor of the ceramic dielectric substrate, etc., the distance from the outer perimeter of the ceramic dielectric substrate to the electrode in the interior after the sintering fluctuates easily. Therefore, when performing grinding of the outer perimeter of the ceramic dielectric substrate, if the grinding is performed undesirably up to a position proximal to the electrode, locations undesirably occur where the distance is short from the outer perimeter of the ceramic dielectric substrate to the outer perimeter of the electrode. Thereby, a problem occurs in that the risk of dielectric breakdown is high.

Thus, an extremely difficult operation is necessary to accurately ascertain the position of the electrode of the interior of the ceramic dielectric substrate, perform grinding of the outer perimeter of the ceramic dielectric substrate, and cause the outer perimeter of the electrode and the outer perimeter of the ceramic dielectric substrate to be as proximal as possible. Therefore, in a conventional electrostatic chuck, a sufficiently ample margin is provided in the distance between the outer perimeter of the electrode and the outer perimeter of the ceramic dielectric substrate to reduce the risk of dielectric breakdown. However, as the distance between the outer perimeter of the electrode and the outer perimeter of the dielectric substrate is increased, the chucking force that is generated at the sealing ring of the electrostatic chuck outer perimeter portion undesirably decreases; and the temperature of the chucked wafer undesirably increases. Further, when the fluctuation of the distance between the outer perimeter of the electrode and the outer perimeter of the dielectric substrate is large, a problem occurs in that a portion of the wafer outer perimeter portion or the entire circumference of the wafer outer perimeter portion cannot be cooled uniformly.

In JP-A 2012-235037 (Kokai), a configuration is discussed in which a built-in electrode overlaps under an outermost perimeter sealing ring in a Coulomb-type electrostatic chuck cross-sectional view. However, the chucking force for attracting and holding the wafer is generated in the portion directly above the sealing ring overlapping the electrode. Therefore, one important component to provide a uniform wafer temperature distribution is to dispose the outer diameter of the electrode in the region where the electrode overlaps the sealing ring to be proximal to the outer perimeter of the electrostatic chuck, and to make the built-in electrode and the electrode outer diameter even more uniform.

In JP-A 2009-302346 (Kokai), a configuration is discussed in which the sealing ring width is widened to provide a configuration in which the built-in electrode overlaps under the outermost perimeter sealing ring. However, the plasma inside the process also erodes the ceramic dielectric. Therefore, the sealing ring surface which is a direct contact portion with the wafer may be eroded by the plasma; and the surface state of the sealing ring portion may fluctuate. Then, the chucking force at the sealing ring portion decreases; the wafer temperature distribution becomes nonuniform; the wafer temperature changes partway through the process, etc.; and the fluctuation of the surface state of the sealing ring portion undesirably causes the life of the electrostatic chuck to decrease.

SUMMARY OF THE INVENTION

Figure 1:
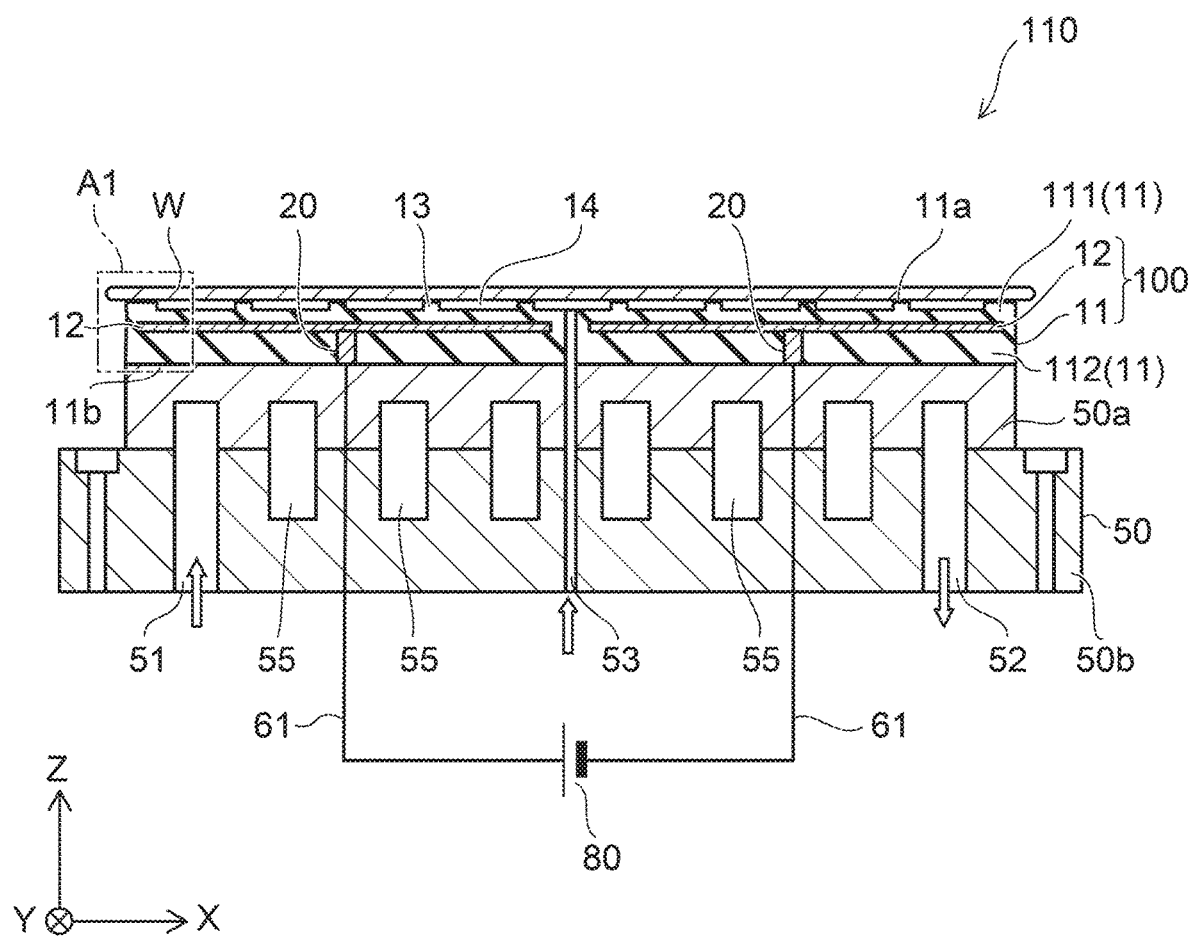
FIG. 1 is a schematic cross-sectional view illustrating the configuration of an electrostatic chuck according to the embodiment.

A first aspect of the present invention is an electrostatic chuck including a ceramic dielectric substrate and an electrode layer, the ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body, the electrode layer being interposed between the first major surface and the second major surface of the ceramic dielectric substrate and sintered in the ceramic dielectric substrate as one body, the electrode layer including multiple electrode components arranged to be separated from each other, an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface, the spacing between the outer perimeter of the electrode layer and the outer perimeter of the ceramic dielectric substrate being narrower than a spacing of the plurality of electrode components when viewed from the direction, a width of the sealing ring being not less than 0.3 millimeters and not more than 3 millimeters, a width where the electrode layer overlaps the sealing ring being not less than −0.7 millimeters and not more than 2 millimeters when viewed in the direction.

According to the electrostatic chuck, while maintaining the insulation breakdown voltage at the outer perimeter portion of the ceramic dielectric substrate, a large and constant chucking force can be obtained at the ceramic dielectric substrate outer perimeter portion; and uniformity of the temperature distribution of the processing object can be realized. By disposing the electrode layer up to a position proximal to the outer perimeter of the ceramic dielectric substrate, the chucking force at the outer perimeter portion of the ceramic dielectric substrate is constant even in the case where the width of the sealing ring is narrow. Thereby, the contact surface area between the wafer and the ceramic dielectric substrate and the chucking force at the ceramic dielectric substrate are uniform in the circumferential direction; and both the decrease of the temporal change rate of the temperature of the processing object and the decrease of the temperature change of the end portion of the processing object can be realized.

A second aspect of the present invention is an electrostatic chuck including a ceramic dielectric substrate and an electrode layer, the ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body, the electrode layer being interposed between the first major surface and the second major surface of the ceramic dielectric substrate and being sintered in the ceramic dielectric substrate as one body, an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface, a mutual error of a spacing between the outer perimeter of the electrode layer and the outer perimeter of the ceramic dielectric substrate on a first imaginary line extending in an outer circumferential direction from a center of the ceramic dielectric substrate being 200 micrometers or less, a width of the sealing ring being not less than 0.3 millimeters and not more than 3 millimeters, a width where the electrode layer overlaps the sealing ring being not less than −0.7 millimeters and not more than 2 millimeters when viewed in the direction.

According to the electrostatic chuck, because the fluctuation of the spacing between the outer perimeter of the ceramic dielectric substrate and the outer perimeter of the electrode is low, while maintaining the insulation breakdown voltage at the outer perimeter portion of the ceramic dielectric substrate, a large and constant chucking force can be obtained at the ceramic dielectric substrate outer perimeter portion; and the uniformity of the temperature distribution of the processing object can be realized. By disposing the electrode layer up to a position proximal to the outer perimeter of the ceramic dielectric substrate, the chucking force at the outer perimeter portion of the ceramic dielectric substrate is constant even in the case where the width of the sealing ring is narrow. Thereby, the contact surface area between the wafer and the ceramic dielectric substrate and the chucking force at the ceramic dielectric substrate are uniform in the circumferential direction; and both the decrease of the temporal change rate of the temperature of the processing object and the decrease of the temperature change of the end portion of the processing object can be realized.

A third aspect of the present invention is an electrostatic chuck including a ceramic dielectric substrate and an electrode layer, the ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body, the electrode layer being interposed between the first major surface and the second major surface of the ceramic dielectric substrate and sintered in the ceramic dielectric substrate as one body, an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface, $|X1-X2|/X5$ being not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, an outer diameter X5 is an outer diameter of the outer perimeter of the electrode layer, a width of the sealing ring is not less than 0.3 millimeters and not more than 3 millimeters, and a width where the electrode layer overlaps the sealing ring is not less than −0.7 millimeters and not more than 2 millimeters when viewed in the direction.

According to the electrostatic chuck, because the fluctuation with respect to the electrode outer diameter of the spacing between the outer perimeter of the ceramic dielectric substrate and the outer perimeter of the electrode is low, while maintaining the insulation breakdown voltage at the outer perimeter portion of the ceramic dielectric substrate, a large and constant chucking force can be obtained at the ceramic dielectric substrate outer perimeter portion; and the uniformity of the temperature distribution of the processing object can be realized. By disposing the electrode layer up to a position proximal to the outer perimeter of the ceramic dielectric substrate, the chucking force at the outer perimeter portion of the ceramic dielectric substrate is constant even in the case where the width of the sealing ring is narrow. Thereby, the contact surface area between the wafer and the ceramic dielectric substrate and the chucking force at the ceramic dielectric substrate are uniform in the circumferential direction; and both the decrease of the temporal change rate of the temperature of the processing object and the decrease of the temperature change of the end portion of the processing object can be realized.

A fourth aspect of the present invention is an electrostatic chuck including a ceramic dielectric substrate and an electrode layer, the ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body, the electrode layer being interposed between the first major surface and the second major surface of the ceramic dielectric substrate and being sintered in the ceramic dielectric substrate as one body, an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface, a spacing between the outer perimeter of the electrode layer and the outer perimeter of the ceramic dielectric substrate on a first imaginary line extending in an outer circumferential direction from a center of the ceramic dielectric substrate being 2 millimeters or less, a mutual error of the spacing between the outer perimeter of the electrode layer and the outer perimeter of the ceramic dielectric substrate being 200 micrometers or less, a straight-line distance between an inner perimeter side end portion of the sealing ring and an outer perimeter end portion of the electrode layer being 2 millimeters or less.

According to the electrostatic chuck, the fluctuation with respect to the electrode outer diameter of the spacing between the outer perimeter of the ceramic dielectric substrate and the outer perimeter of the electrode is low. Therefore, a large and constant chucking force can be obtained at the outer perimeter portion of the ceramic dielectric substrate while maintaining the insulation breakdown voltage at the outer perimeter portion of the ceramic dielectric substrate. The uniformity of the temperature distribution of the processing object can be realized. By disposing the electrode layer up to a position proximal to the outer perimeter of the ceramic dielectric substrate, the chucking force at the outer perimeter portion of the ceramic dielectric substrate is constant even in the case where the width of the sealing ring is narrow. Thereby, the contact surface area between the wafer and the ceramic dielectric substrate and the chucking force at the ceramic dielectric substrate are uniform in the circumferential direction; and both the decrease of the temporal change rate of the temperature of the processing object and the decrease of the temperature change of the end portion of the processing object can be realized.

A fifth aspect of the present invention is the electrostatic chuck of any one invention of the first to fourth aspects, wherein S1/S2 is not less than −3.4% and not more than 5%, where a surface area S1 is a surface area of a region where the electrode layer overlaps the sealing ring when viewed in the direction, and a surface area S2 is a surface area of the ceramic dielectric substrate when viewed in the direction.

According to the electrostatic chuck, by disposing the electrode layer up to a position proximal to the outer perimeter of the ceramic dielectric substrate, the chucking force at the outer perimeter portion of the ceramic dielectric substrate is constant even in the case where the width of the sealing ring is narrow. Thereby, both the decrease of the temporal change rate of the temperature of the processing object and the decrease of the temperature change of the end portion of the processing object can be realized.

A sixth aspect of the present invention is the electrostatic chuck of any one invention of the first to fifth aspects, wherein the spacing between the outer perimeter of the electrode layer and the outer perimeter of the ceramic dielectric substrate is greater than 0 millimeters and not more than 1.95 millimeters.

According to the electrostatic chuck, because the electrode is disposed up to the vicinity of the outer perimeter of the ceramic dielectric substrate, the uniformity of the temperature distribution of the processing object can be realized while maintaining the insulation breakdown voltage at the outer perimeter portion of the ceramic dielectric substrate.

A seventh aspect of the present invention is the electrostatic chuck of any one invention of the first to sixth aspects, wherein LX5/LX6 is not less than 97.4% and not more than 99.6%, where a circumference LX5 is a length of the outer perimeter of the electrode layer, and a circumference LX6 is a length of the outer perimeter of the ceramic dielectric substrate.

According to the electrostatic chuck, the uniformity of the temperature distribution of the processing object can be realized while maintaining the insulation breakdown voltage at the outer perimeter portion of the ceramic dielectric substrate.

An eighth aspect of the present invention is the electrostatic chuck of any one invention of the first to seventh aspects, wherein SX5/SX6 is not less than 95.1% and not more than 99.2%, where a surface area SX5 is a surface area of a circle specified by an outer diameter of the outer perimeter of the electrode layer, and a surface area SX6 is a surface area of a circle specified by an outer diameter of the outer perimeter of the ceramic dielectric substrate.

According to the electrostatic chuck, the uniformity of the temperature distribution of the processing object can be realized while maintaining the insulation breakdown voltage at the outer perimeter portion of the ceramic dielectric substrate.

A ninth aspect of the present invention is the electrostatic chuck of any one invention of the first to eighth aspects, wherein |X1−X3|/X5 is not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

According to the electrostatic chuck, while maintaining the insulation breakdown voltage at the outer perimeter portion of the ceramic dielectric substrate, a large and constant chucking force can be obtained at the ceramic dielectric substrate outer perimeter portion; and the uniformity of the temperature distribution of the processing object can be realized.

A tenth aspect of the present invention is the electrostatic chuck of any one invention of the first to ninth aspects, wherein ||X1−X2|−|X3−X4|| is not less than 0 micrometers and not more than 200 micrometers, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, and the fourth imaginary line is an imaginary line extending in an outer circumferential direction from the center of the ceramic dielectric substrate and extending on a side opposite to the third imaginary line.

According to the electrostatic chuck, the uniformity of the temperature distribution of the processing object can be realized while maintaining the insulation breakdown voltage at the outer perimeter portion of the ceramic dielectric substrate.

An eleventh aspect of the present invention is the electrostatic chuck of any one invention of the first to tenth aspects, wherein ||X1−X2|−|X3−X4||/X5 is not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, the fourth imaginary line is an imaginary line extending in an outer circumferential direction from the center of the ceramic dielectric substrate and extending on a side opposite to the third imaginary line, and an outer diameter X5 is an outer diameter of the outer perimeter of the electrode layer.

According to the electrostatic chuck, the uniformity of the temperature distribution of the processing object can be realized while maintaining the insulation breakdown voltage at the outer perimeter portion of the ceramic dielectric substrate.

A twelfth aspect of the present invention is the electrostatic chuck of any one invention of the first to eleventh aspects, wherein |X1+X3|/X5 is not less than 0% and not more than 0.15%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

According to the electrostatic chuck, the uniformity of the temperature distribution of the processing object can be realized while maintaining the insulation breakdown voltage at the outer perimeter portion of the ceramic dielectric substrate.

A thirteenth aspect of the present invention is the electrostatic chuck of any one invention of the first to twelfth aspects, wherein |X1×X3|/X5 is not less than 0% and not more than 15%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

According to the electrostatic chuck, the uniformity of the temperature distribution of the processing object can be realized while maintaining the insulation breakdown voltage at the outer perimeter portion of the ceramic dielectric substrate.

A fourteenth aspect of the present invention is the electrostatic chuck of any one invention of the first to thirteenth aspects, wherein |X1−X2|/|X3−X4| is not less than 0 and not more than 200, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, and the fourth imaginary line is an imaginary line extending in an outer circumferential direction from the center of the ceramic dielectric substrate and extending on a side opposite to the third imaginary line.

According to the electrostatic chuck, the uniformity of the temperature distribution of the processing object can be realized while maintaining the insulation breakdown voltage at the outer perimeter portion of the ceramic dielectric substrate.

A fifteenth aspect of the present invention is a wafer processing apparatus including the electrostatic chuck of any one invention of the first to fourteenth aspects.

According to the wafer processing apparatus, the in-plane temperature distribution of the wafer (the processing object) is uniform the prescribed processes can be performed without reducing the yield of the wafer (the processing object).

DETAILED DESCRIPTION OF ILLUSTRATIVE EMBODIMENTS

Illustrative embodiments of the invention will now be described in detail with reference to the drawings. Similar components in the drawings are marked with the same reference numerals; and a detailed description is omitted as appropriate.

FIG. 1 is a schematic cross-sectional view illustrating the configuration of an electrostatic chuck according to the embodiment.

As illustrated in FIG. 1, the electrostatic chuck 110 according to the embodiment includes a ceramic dielectric substrate 11 and an electrode layer 12.

The ceramic dielectric substrate 11 is, for example, a base material that is made of a polycrystalline ceramic sintered body having a flat plate configuration, has a first major surface 11a where a processing object W such as a semiconductor wafer or the like is placed, and has a second major surface 11b on the side opposite to the first major surface 11a.

The electrode layer 12 is interposed between the first major surface 11a and the second major surface 11b of the ceramic dielectric substrate 11. In other words, the electrode layer 12 is formed to be inserted into the ceramic dielectric substrate 11. The electrode layer 12 is sintered in the ceramic dielectric substrate 11 as one body. An electrostatic chuck substrate 100 is a structural component having a plate configuration that includes the ceramic dielectric substrate 11, and the electrode layer 12 provided in the ceramic dielectric substrate 11.

The electrostatic chuck 110 is, for example, a Coulomb-type electrostatic chuck. The volume resistivity of the ceramic dielectric substrate 11 is, for example, $1 \times 10^{14}$ Ω·cm or more. The electrostatic chuck 110 attracts and holds the processing object W by an electrostatic force by generating a charge on the first major surface 11a side of the electrode layer 12 by applying a chucking voltage 80 to the electrode layer 12.

Here, in the description of the embodiment, a direction that connects the first major surface 11a and the second major surface 11b is taken as a Z-direction; one direction orthogonal to the Z-direction is taken as an X-direction; and a direction orthogonal to the Z-direction and the X-direction is taken as a Y-direction.

The electrode layer 12 is provided along the first major surface 11a and the second major surface 11b of the ceramic dielectric substrate 11. The electrode layer 12 is a chucking electrode for attracting and holding the processing object W. The electrode layer 12 may be unipolar or dipolar. The electrode layer 12 may be tripolar or another multi-pole type. The number and/or arrangement of the electrode layers 12 is appropriately selected. The electrode layer 12 illustrated in FIG. 1 is dipolar; and the two-pole electrode layer 12 is provided in the same plane.

The ceramic dielectric substrate 11 includes a first dielectric layer 111 between the electrode layer 12 and the first major surface 11a, and a second dielectric layer 112 between the electrode layer 12 and the second major surface 11b. It is favorable for the transmittance of at least the first dielectric layer 111 of the ceramic dielectric substrate 11 for visible light to be, for example, greater than 0% and not more than 3.7%. Here, the transmittance for visible light is the transmittance when light of a wavelength of about 600 nm is irradiated on a dielectric having a thickness of 1 millimeter.

By setting the transmittance of at least the first dielectric layer 111 of the ceramic dielectric substrate 11 for visible light to be within the range recited above, the position of the electrode layer 12 provided in the interior of the ceramic dielectric substrate 11 can be confirmed easily from outside the ceramic dielectric substrate 11.

If the transmittance of the second dielectric layer 112 of the ceramic dielectric substrate 11 for visible light is within the range recited above, the position of the electrode layer 12 can be confirmed from the second major surface 11b side prior to bonding between the ceramic dielectric substrate 11 and a base plate 50.

In the ceramic dielectric substrate 11 applied in the embodiment, for example, it is possible to measure the position of the electrode layer 12 using a measurement method such as X-ray CT, etc., instead of measuring the position of the electrode layer 12 using a measuring device unsuitable to fine dimension measurements such as an ultrasonic flaw detector, etc. However, instead of measuring using a measuring device unsuitable mass production, it is favorable for the position of the electrode layer 12 of the interior to be measured from outside the ceramic dielectric substrate 11 using a general measuring device such as a measuring microscope, etc. Accordingly, when performing grinding of the outer perimeter of the ceramic dielectric substrate 11 after sintering the ceramic dielectric substrate 11, the grinding can be performed after easily and accurately measuring the position (e.g., the position of the outer perimeter) of the electrode layer 12 in the interior of the ceramic dielectric substrate 11. In other words, the grinding can be performed while correcting the positional shift and/or contraction dimensional error that may occur. Therefore, in the ceramic dielectric substrate 11 applied in the embodiment, the spacing between the outer perimeter of the ceramic dielectric substrate 11 and the outer perimeter of the electrode layer 12 when viewed from the Z-direction is uniform. Here, "uniform" in the embodiment includes the error when manufacturing. The "error when manufacturing" is, for example, about 200 micrometers (μm) or less.

A specific configuration example of the electrostatic chuck 110 will now be described.

As illustrated in FIG. 1, the electrostatic chuck 110 is mounted on the base plate 50. A heat-resistant resin such as silicone or the like, indium bonding, brazing, or the like is used to mount the electrostatic chuck 110 to the base plate 50. Although the bonding material is appropriately selected from the perspective of the temperature zone of use, the cost, etc., a material that has a large thermal conductivity is more favorable.

For example, the base plate 50 is divided into an upper portion 50a and a lower portion 50b that are made of aluminum; and a passageway 55 is provided between the upper portion 50a and the lower portion 50b. One end side of the passageway 55 is connected to an input path 51; and the other end side of the passageway 55 is connected to an output path 52.

The base plate 50 performs the role of performing temperature adjustment of the electrostatic chuck 110. For example, when cooling the electrostatic chuck 110, a cooling medium is caused to inflow from the input path 51, pass through the passageway 55, and outflow from the output path 52. Thereby, the heat of the base plate 50 is absorbed by the cooling medium; and the electrostatic chuck 110 that is mounted on the base plate 50 can be cooled.

On the other hand, when maintaining the temperature of the electrostatic chuck 110, it is also possible to introduce a heat-retaining medium inside the passageway 55. Or, it is also possible to build a heating element into the electrostatic chuck 110 and/or the base plate 50. Thus, the temperature of the processing object W chucked by the electrostatic chuck 110 can be adjusted easily by adjusting the temperature of the electrostatic chuck 110 via the base plate 50.

Protrusions 13 are provided on the first major surface 11a side of the ceramic dielectric substrate 11 as necessary; and grooves 14 are provided between the protrusions 13. The grooves 14 communicate with each other; and a space is formed between the grooves 14 and the back surface of the processing object W placed on the electrostatic chuck 110.

An introduction path 53 that pierces the base plate 50 and the ceramic dielectric substrate 11 is connected to the grooves 14. When a transfer gas such as helium (He) or the like is introduced from the introduction path 53 in the state in which the processing object W is chucked, the transfer gas flows into the space provided between the processing object W and the grooves 14; and the processing object W can be cooled directly by the transfer gas.

Here, the temperature of the processing object W and/or the particles adhering to the processing object W can be controlled to a favorable state by appropriately selecting the height of the protrusion (the depth of the groove 14) and the surface area ratio, configurations, etc., of the protrusions 13 and the grooves 14.

A connection portion 20 is provided at the second major surface 11b of the ceramic dielectric substrate 11. A contact electrode 61 is provided in the upper portion 50a of the base plate 50 corresponding to the position of the connection portion 20. Accordingly, when the electrostatic chuck 110 is mounted to the upper portion 50a of the base plate 50, the contact electrode 61 contacts the connection portion 20; thereby, the contact electrode 61 and the electrode layer 12 are electrically connected via the connection portion 20.

For example, a movable probe is used as the contact electrode 61. Thereby, reliable contact is provided between the contact electrode 61 and the connection portion 20; and damage to the connection portion 20 due to the contact of the contact electrode 61 is suppressed to a minimum. The contact electrode 61 is not limited to that recited above; and any form may be used such as a configuration in which the contact electrode 61 simply contacts the connection portion 20, a configuration in which the contact electrode 61 is connected to the connection portion 20 by fitting together or screwing together, etc.

The ceramic dielectric substrate 11 will now be described in detail.

The material of the crystal included in the ceramic dielectric substrate 11 is, for example, one of $Al_2O_3$, $Y_2O_3$, or YAG. The visible light transmissivity, the insulation stability, and the plasma resistance of the ceramic dielectric substrate 11 can be increased by using this material.

The thickness of the first dielectric layer 111 of the ceramic dielectric substrate 11 is, for example, 100 micrometers or more. A sufficient insulation breakdown voltage of the electrostatic chuck 110 can be maintained when the thickness of the first dielectric layer 111 is 100 micrometers or more. The thickness of the first dielectric layer 111 greatly affects the chucking force and may be appropriately set to set the temperature of the processing object W to the desired temperature. In the embodiment, the thickness of the first dielectric layer 111 may be set to, for example, 100 micrometers to 1000 micrometers, and more favorably 100 micrometers to 500 micrometers.

Similarly, the thickness of the second dielectric layer 112 of the ceramic dielectric substrate 11 may be appropriately set. Considering the mechanical strength and the coolability of the ceramic dielectric substrate 11, it is favorable for the thickness of the entire electrostatic chuck substrate 100 in which the electrode layer 12 is provided in the ceramic dielectric substrate 11 to be, for example, 0.5 millimeters to 7 millimeters.

The electrode layer 12 will now be described in detail.

Figure 2A:
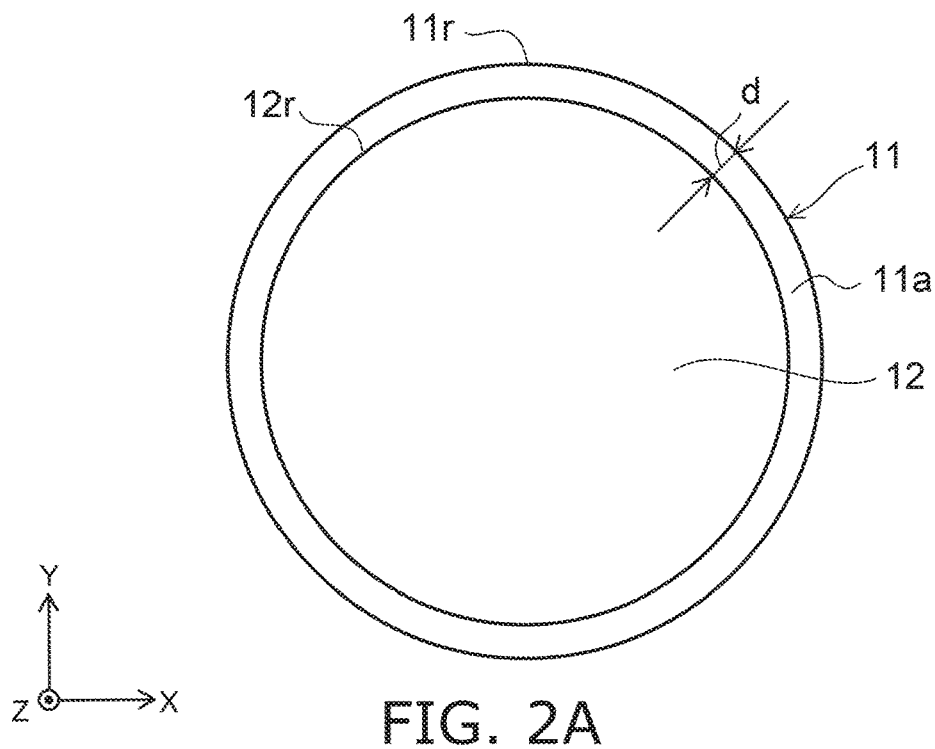
FIGS. 2A and 2B are schematic plan views illustrating configurations of the electrode layer.
Figure 2B:
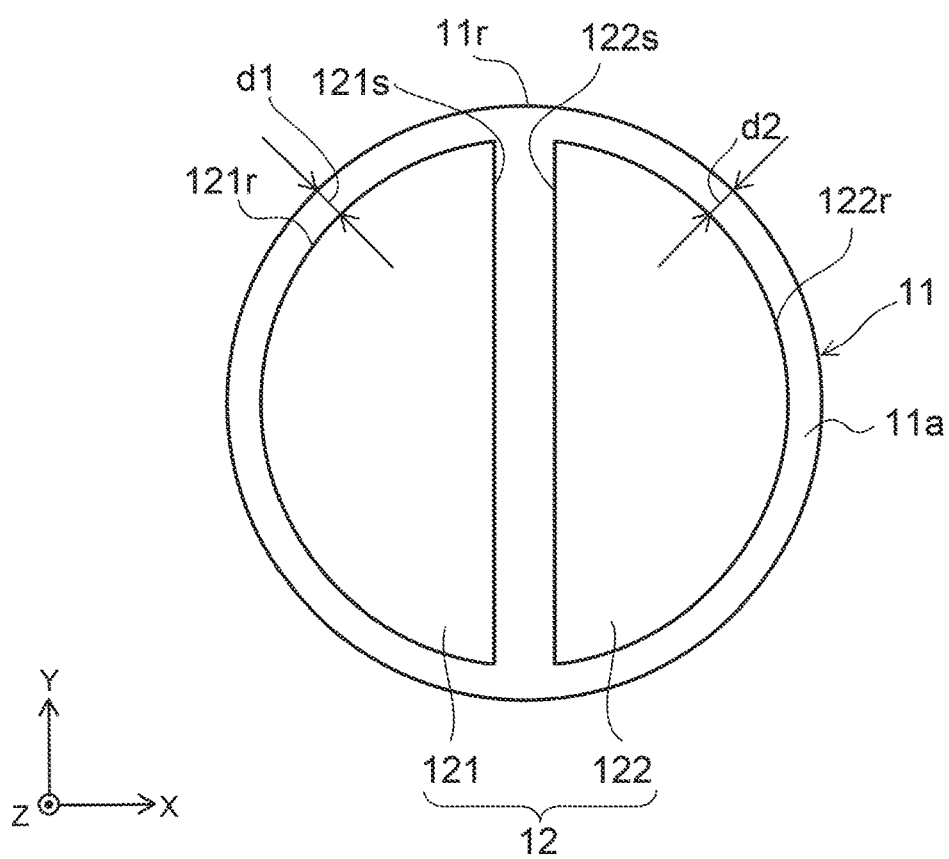

FIGS. 2A and 2B are schematic plan views illustrating configurations of the electrode layer.

In FIGS. 2A and 2B, the exterior forms of the ceramic dielectric substrate 11 and the electrode layer 12 are illustrated by solid lines for convenience of description.

An example of a unipolar electrode layer 12 is illustrated in FIG. 2A. The electrode layer 12 is provided as substantially a circle when viewed from the Z-direction. The exterior form of the ceramic dielectric substrate 11 when viewed from the Z-direction also is substantially a circle. The electrode layer 12 is disposed on a circle concentric with the ceramic dielectric substrate 11.

An example of a dipolar electrode layer 12 is illustrated in FIG. 2B. The electrode layer 12 includes a first electrode component 121 and a second electrode component 122. The first electrode component 121 and the second electrode component 122 are arranged to be separated from each other. The configurations of the first electrode component 121 and the second electrode component 122 each are substantially semicircles.

The first electrode component 121 includes a first outer perimeter side 121r and a first straight-line side 121s. The first outer perimeter side 121r is the side of a circular arc portion of a substantially semicircular exterior form. The first straight-line side 121s is the side of a straight-line portion of the substantially semicircular exterior form.

The second electrode component 122 includes a second outer perimeter side 122r and a second straight-line side 122s. The second outer perimeter side 122r is the side of a circular arc portion of a substantially semicircular exterior form. The second straight-line side 122s is the side of a straight-line portion of the substantially semicircular exterior form.

The first straight-line side 121s and the second straight-line side 122s are arranged to face each other. The exterior form of the electrode layer 12 including the gap between the first electrode component 121 and the second electrode component 122 is substantially a circle.

Grinding of the ceramic dielectric substrate 11 is performed after the sintering. For example, the exterior form of the ceramic dielectric substrate 11 is formed by grinding the outer perimeter while rotating the ceramic dielectric substrate 11.

In the example illustrated in FIG. 2A, a spacing d between an outer perimeter 11r of the ceramic dielectric substrate 11 and an outer perimeter 12r of the electrode layer 12 is provided to be uniform over substantially the entire outer perimeter 11r. In the example illustrated in FIG. 2B, a spacing d1 between the outer perimeter 11r of the ceramic dielectric substrate 11 and the first outer perimeter side 121r of the first electrode component 121 and a spacing d2 between the outer perimeter 11r of the ceramic dielectric substrate 11 and the second outer perimeter side 122r of the second electrode component 122 are provided to be uniform over the outer perimeter 11r. In other words, the spacing d1 and the spacing d2 are uniform over the outer perimeter 11r.

Because a material that transmits visible light is included in the ceramic dielectric substrate 11 applied in the embodiment, when performing the grinding of the outer perimeter 11r of the ceramic dielectric substrate 11, the grinding can be performed accurately while confirming the position of the outer perimeter 12r (the first outer perimeter side 121r and the second outer perimeter side 122r) of the electrode layer 12 provided in the interior of the ceramic dielectric substrate 11. Thereby, the spacings d, d1, and d2 can be formed uniformly over substantially the entire outer perimeter 11r.

Although examples of the unipole-type and the dipole-type are described as the electrode layer 12 in FIGS. 2A and 2B, this is applicable in the case of the electrode layer 12 having three or more poles as well. In the electrode layer 12 having three or more poles, it is sufficient for the exterior form of the multiple electrode components corresponding to the poles including the gaps between the electrode components to be provided in a substantially circular configuration.

The arrangement between the ceramic dielectric substrate 11 and the electrode layer 12 will now be described.

Figure 3:
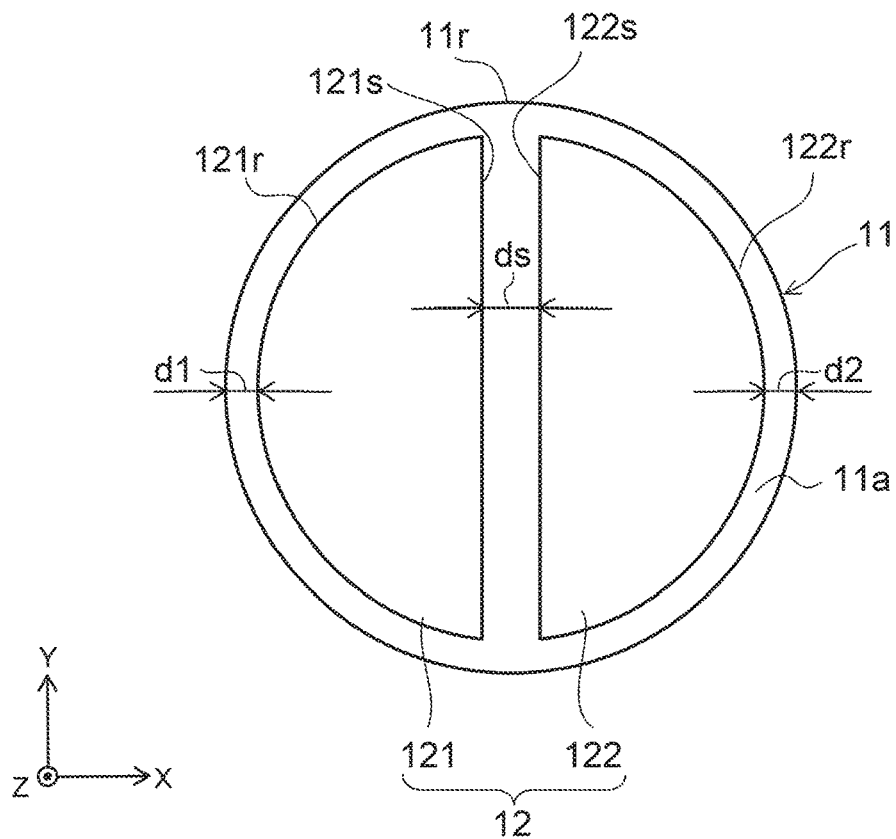
FIG. 3 is a schematic plan view illustrating a first arrangement of the ceramic dielectric substrate and the electrode layer.

FIG. 3 is a schematic plan view illustrating a first arrangement of the ceramic dielectric substrate and the electrode layer.

In FIG. 3, the exterior forms of the ceramic dielectric substrate and the electrode layer 12 are illustrated by solid lines for convenience of description.

The electrode layer 12 illustrated in FIG. 3 is dipolar and includes the first electrode component 121 and the second electrode component 122. Here, the spacing between the first straight-line side 121s of the first electrode component 121 and the second straight-line side 122s of the second electrode component 122 is taken as a spacing ds. As described above, the spacing between the first outer perimeter side 121r and the outer perimeter 11r of the ceramic dielectric substrate 11 is the spacing d1; and the spacing between the second outer perimeter side 122r and the outer perimeter 11r of the ceramic dielectric substrate 11 is the spacing d2.

In the example illustrated in FIG. 3, the spacings d1 and d2 are narrower than the spacing ds. In other words, the spacings d1 and d2 are uniform over the outer perimeter 11r and are narrower than the spacing ds. Thereby, the electrode layer 12 can be disposed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of a sealing ring 13a (referring to FIG. 21). Thereby, while maintaining the insulation breakdown voltage at the outer perimeter portion of the ceramic dielectric substrate 11, a uniform chucking force is obtained over a wide area of the processing object; and the temperature distribution of the processing object when chucked can be set to be uniform.

Figure 4:
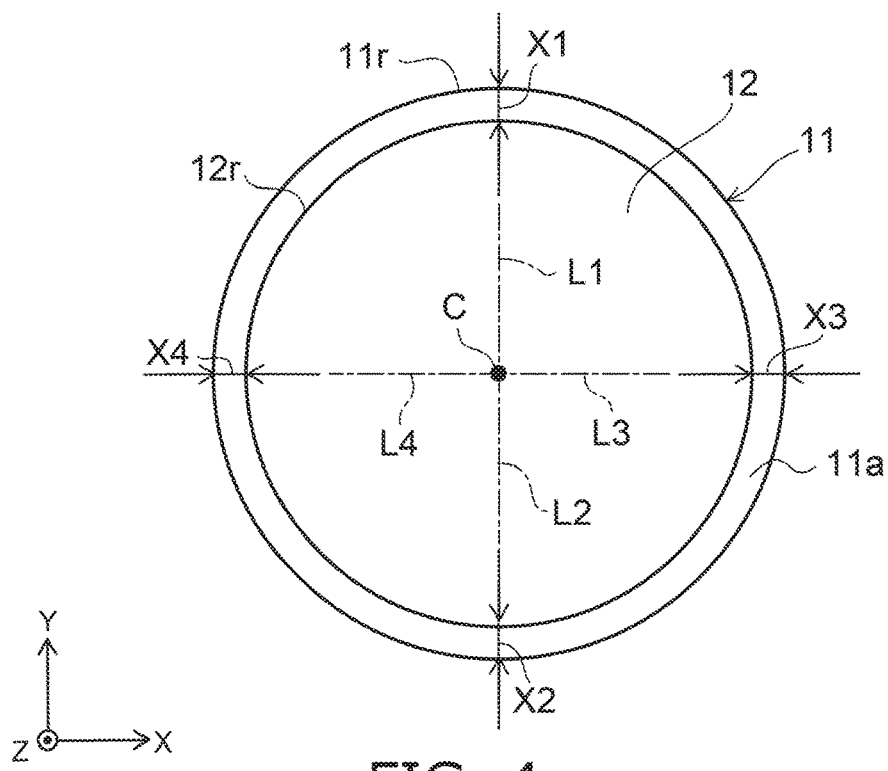
FIG. 4 is a schematic plan view illustrating a second arrangement of the ceramic dielectric substrate and the electrode layer.

FIG. 4 is a schematic plan view illustrating a second arrangement of the ceramic dielectric substrate and the electrode layer.

In FIG. 4, the exterior forms of the ceramic dielectric substrate and the electrode layer 12 are illustrated by solid lines for convenience of description.

The electrode layer 12 illustrated in FIG. 4 is unipolar. In the electrode layer 12, one of the imaginary lines extending in the direction of the outer perimeter 11r from a position C of the center of the ceramic dielectric substrate 11 is taken as a first imaginary line L1. The spacing between the outer perimeter 12r of the electrode layer 12 and the outer perimeter 11r of the ceramic dielectric substrate 11 on the first imaginary line L1 is taken as the spacing X1. In the example illustrated in FIG. 4, the mutual error of the spacing X1 is 200 micrometers or less. The mutual error of the spacing X1 refers to the mutual error between the spacings X1 on each first imaginary line L1 when the first imaginary line L1 is set to mutually-different angles having the position C as the center.

Here, in the electrode layer 12 and the ceramic dielectric substrate 11 illustrated in FIG. 4, among the imaginary lines extending toward the outer perimeter 11r from the position C, the imaginary line extending on the side opposite to the first imaginary line L1 is taken as a second imaginary line L2; one of the imaginary lines extending in a direction orthogonal to the first imaginary line L1 is taken as a third imaginary line L3; and the imaginary line extending on the side opposite to the third imaginary line L3 is taken as a fourth imaginary line L4.

The spacing between the outer perimeter 12r of the electrode layer 12 and the outer perimeter 11r of the ceramic dielectric substrate 11 on the second imaginary line L2 is taken as the spacing X2. The spacing between the outer perimeter 12r of the electrode layer 12 and the outer perimeter 11r of the ceramic dielectric substrate 11 on the third imaginary line L3 is taken as the spacing X3. The spacing between the outer perimeter 12r of the electrode layer 12 and the outer perimeter 11r of the ceramic dielectric substrate 11 on the fourth imaginary line L4 is taken as the spacing X4.

Figure 5:
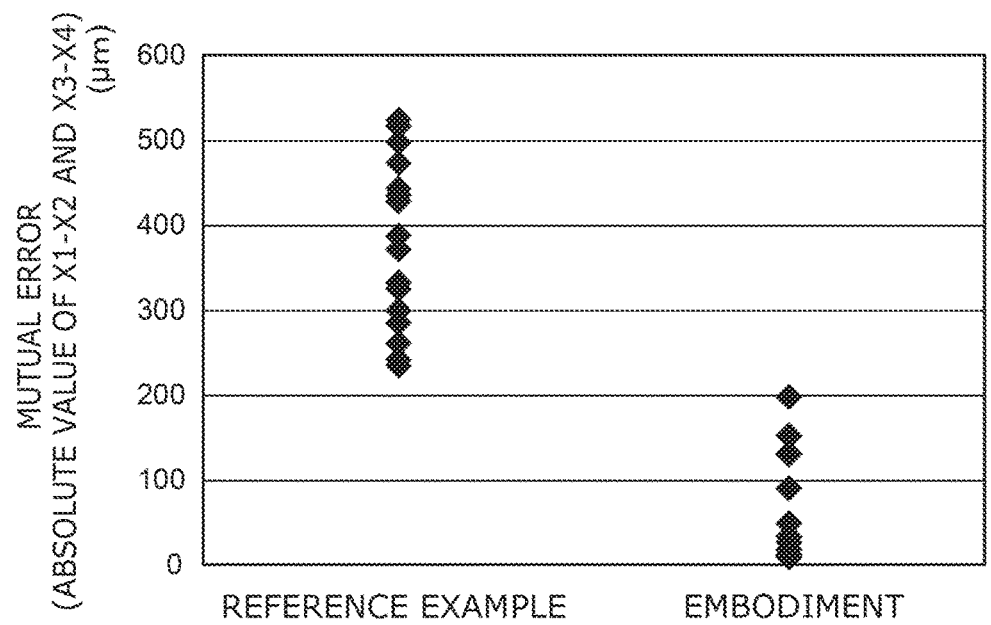
FIG. 5 illustrates the mutual error of the spacing between the ceramic dielectric substrate and the electrode layer.

FIG. 5 illustrates the mutual error of the spacing between the ceramic dielectric substrate and the electrode layer.

FIG. 5 illustrates the mutual error of the spacing for a ceramic dielectric substrate according to a reference example and the mutual error of the spacing for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 5 is the mutual error of the spacing between the ceramic dielectric substrate 11 and the electrode layer 12. The mutual error of the spacing is the maximum value of the absolute value of the spacing X1 minus the spacing X2 and the absolute value of the spacing X3 minus the spacing X4. The units are micrometers (μm). FIG. 5 illustrates the results of measuring the mutual error of the spacing for thirty samples of each of the reference example and the embodiment. In the ceramic dielectric substrate according to the reference example as illustrated in FIG. 5, the mutual error of the spacing is not less than about 200 micrometers and not more than about 520 micrometers. On the other hand, in the ceramic dielectric substrate 11 according to the embodiment, the mutual error of the spacing is 200 micrometers or less.

Thus, in the embodiment, the mutual error of the spacing between the outer perimeter 11r of the ceramic dielectric substrate 11 and the outer perimeter 12r of the electrode layer 12 can be extremely small. Thereby, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 6:
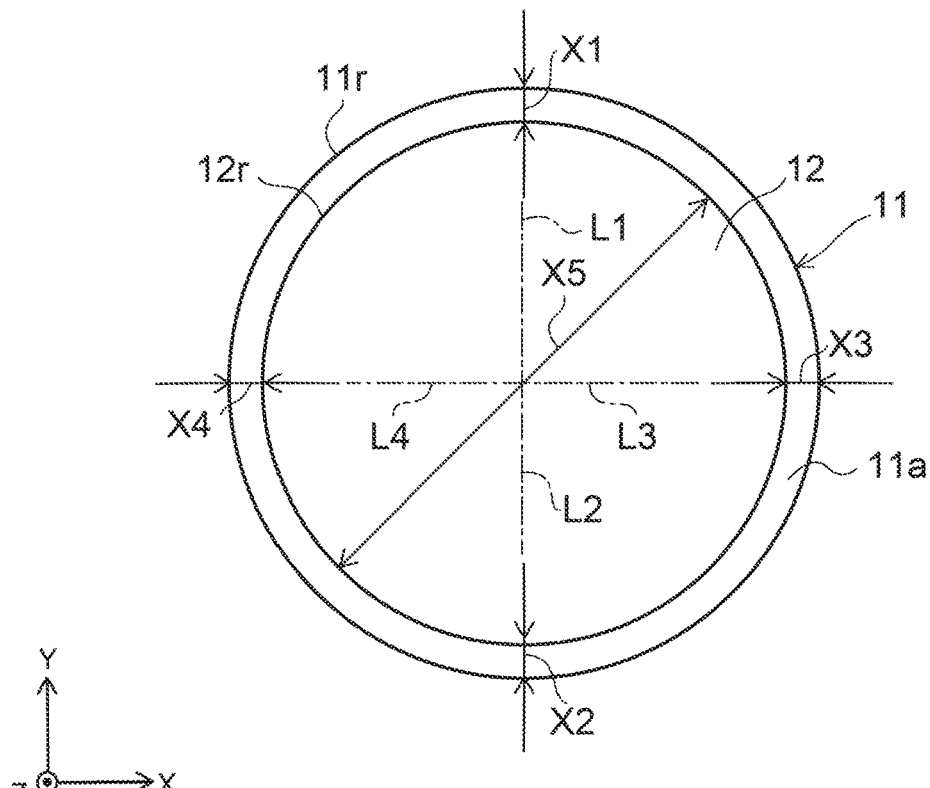
FIG. 6 is a schematic plan view illustrating a third arrangement of the ceramic dielectric substrate and the electrode layer.

FIG. 6 is a schematic plan view illustrating a third arrangement of the ceramic dielectric substrate and the electrode layer.

In FIG. 6, the exterior forms of the ceramic dielectric substrate and the electrode layer 12 are illustrated by solid lines for convenience of description.

The electrode layer 12 illustrated in FIG. 6 is unipolar. In the electrode layer 12, the outer diameter of the outer perimeter 12r of the electrode layer 12 is taken as the outer diameter X5. Here, the outer diameter X5 is the outer diameter in the case where the outermost form of the electrode layer 12 is assumed to be a circle. In other words, the outer diameter X5 is the equivalent circle diameter of the outermost form of the electrode layer 12. In the example illustrated in FIG. 6, |spacing X1−spacing X2|/outer diameter X5 is not less than 0% and not more than 0.07%.

Figure 7:
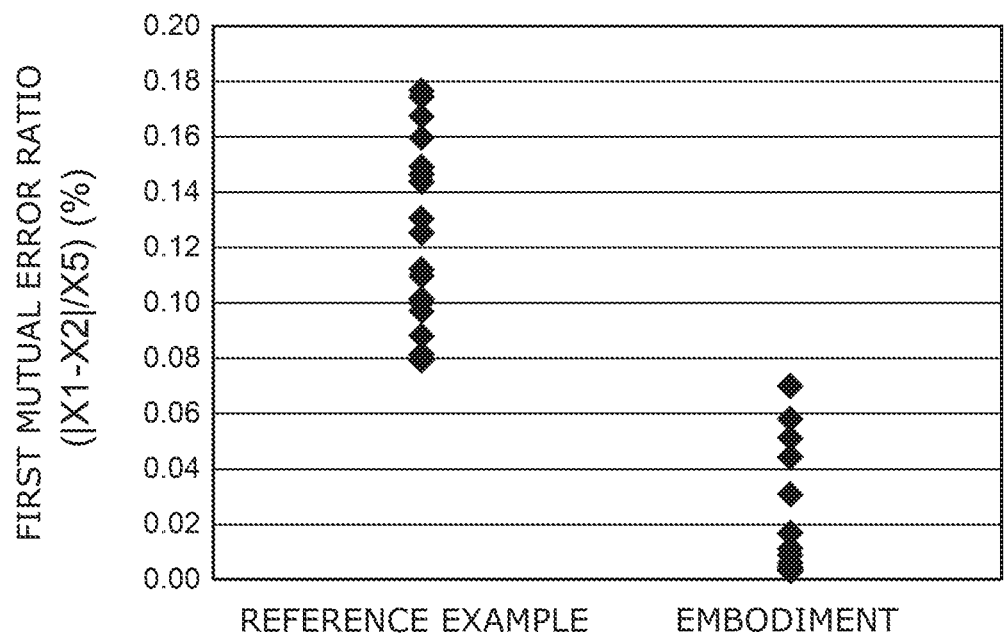
FIG. 7 illustrates a first mutual error ratio of the spacing of the electrode layer to the outer diameter of the ceramic dielectric substrate.

FIG. 7 illustrates a first mutual error ratio of the spacing of the electrode layer to the outer diameter of the ceramic dielectric substrate.

FIG. 7 illustrates the ratio of the absolute value of the spacing X1 minus the spacing X2 to the outer diameter X5 (hereinbelow, called simply the "first mutual error ratio") for the ceramic dielectric substrate according to the reference example and the first mutual error ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 7 is the first mutual error ratio (|spacing X1−spacing X2|/outer diameter X5) of the spacing of the electrode layer 12 to the outer diameter of the ceramic dielectric substrate 11. The units are %. FIG. 7 illustrates the results of measuring the first mutual error ratio for thirty samples of each of the reference example and the embodiment. As illustrated in FIG. 7, for the ceramic dielectric substrate according to the reference example, the first mutual error ratio is not less than about 0.08% and not more than about 0.180%. On the other hand, for the ceramic dielectric substrate 11 according to the embodiment, the first mutual error ratio is not less than 0% and not more than 0.07%.

Thus, in the embodiment, the first mutual error ratio of the spacing of the electrode layer 12 to the outer diameter of the ceramic dielectric substrate 11 can be extremely small. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

In the first arrangement described above, the spacing d1 between the first outer perimeter side 121r and the outer perimeter 11r and the spacing d2 between the second outer perimeter side 122r and the outer perimeter 11r may be set to be greater than 0 millimeters and not more than 1.95 millimeters. More favorably, the spacing d1 and the spacing d2 may be set to be 1.45 millimeters or less, and more favorably 0.95 millimeters or less. For the second to third arrangements described above, the spacings X1 to X4 between the outer perimeter 12r of the electrode layer 12 and the outer perimeter 11r of the ceramic dielectric substrate 11 may be set to be greater than 0 millimeters and not more than 1.95 millimeters. More favorably, the spacings X1 to X4 may be set to be 1.45 millimeters or less, and more favorably 0.95 millimeters or less.

Thus, by setting the spacings d1, d2, and X1 to X4 to be greater than 0 millimeters and not more than 1.95 millimeters, the electrode layer 12 can be provided up to a position extremely proximal to the outer perimeter 11r of the ceramic dielectric substrate 11; and the processing object W can be attracted and held uniformly in a wide area. Accordingly, the temperature distribution of the processing object W when chucked can be set to be uniform.

According to the embodiment, an electrostatic chuck can be provided in which it is possible to dispose the electrode layer 12 uniformly at the lower portion of the sealing ring 13a and the chucked processing object can be maintained at a desired temperature while maintaining the insulation breakdown voltage.

Figure 8:
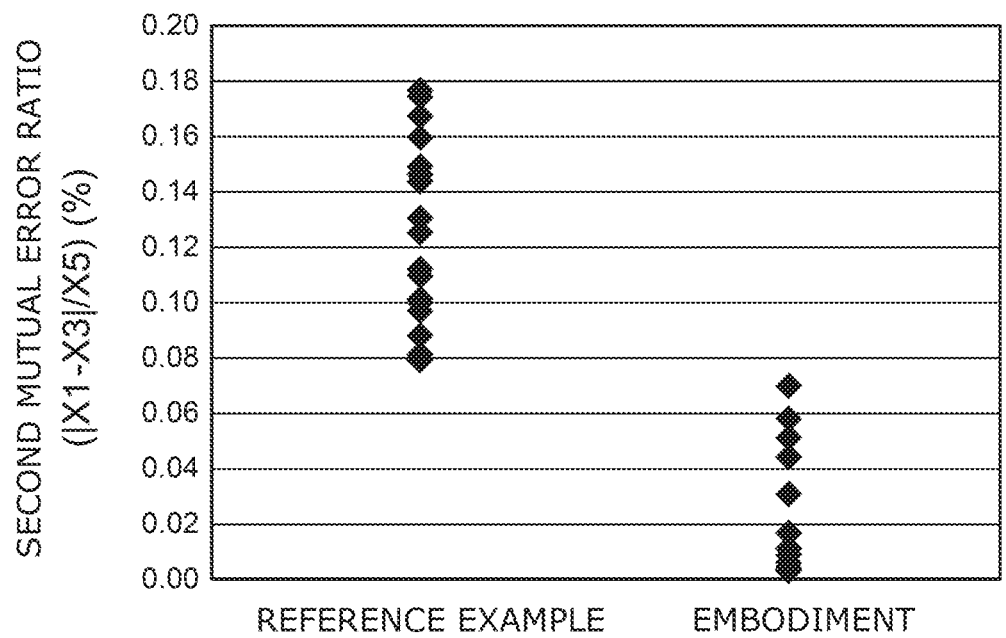
FIG. 8 illustrates a second mutual error ratio of the spacing of the electrode layer to the outer diameter of the ceramic dielectric substrate.

FIG. 8 illustrates a second mutual error ratio of the spacing of the electrode layer to the outer diameter of the ceramic dielectric substrate.

The second mutual error ratio of the spacing of the electrode layer 12 to the outer diameter of the ceramic dielectric substrate 11 will now be described with reference to FIG. 6. FIG. 8 illustrates the ratio of the absolute value of the spacing X1 minus the spacing X3 to the outer diameter X5 (hereinbelow, called simply the "second mutual error ratio") for the ceramic dielectric substrate according to the reference example and the second mutual error ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 8 is the second mutual error ratio (|spacing X1−spacing X3|/outer diameter X5) of the spacing of the electrode layer 12 to the outer diameter of the ceramic dielectric substrate 11. The units are %. FIG. 8 illustrates the results of measuring the second mutual error ratio for thirty samples of each of the reference example and the embodiment. As illustrated in FIG. 8, for the ceramic dielectric substrate according to the reference example, the second mutual error ratio is not less than about 0.08% and not more than about 0.180%. On the other hand, for the ceramic dielectric substrate 11 according to the embodiment, the second mutual error ratio is not less than 0% and not more than 0.07%.

Thus, in the embodiment, the second mutual error ratio of the spacing of the electrode layer 12 to the outer diameter of the ceramic dielectric substrate 11 can be extremely small. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

The second mutual error ratio may be represented by the ratio (|spacing X1−spacing X4|/outer diameter X5) of the absolute value of the spacing X1 minus the spacing X4 to the outer diameter X5 for the ceramic dielectric substrate. Even in such a case, for the ceramic dielectric substrate according to the reference example, the second mutual error ratio is not less than about 0.08% and not more than about 0.180%. On the other hand, for the ceramic dielectric substrate 11 according to the embodiment, the second mutual error ratio is not less than 0% and not more than 0.07%.

Figure 9:
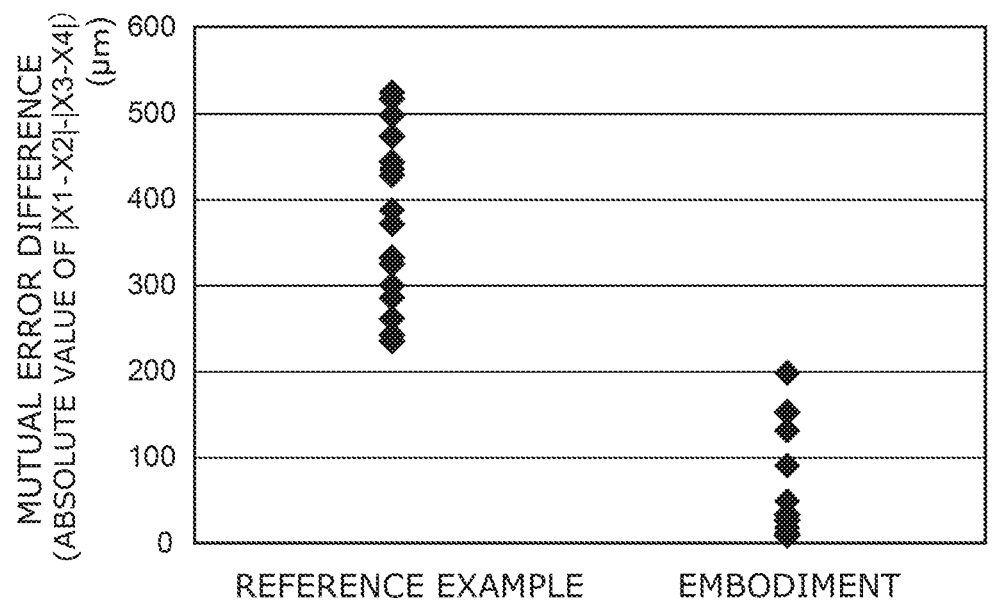
FIG. 9 illustrates a mutual error difference of the spacing between the ceramic dielectric substrate and the electrode layer.

FIG. 9 illustrates a mutual error difference of the spacing between the ceramic dielectric substrate and the electrode layer.

The mutual error difference of the spacing between the ceramic dielectric substrate 11 and the electrode layer 12 will now be described with reference to FIG. 6. FIG. 9 illustrates the mutual error difference of the spacing for the ceramic dielectric substrate according to the reference example and the mutual error difference of the spacing for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 9 is the mutual error difference of the spacing between the ceramic dielectric substrate 11 and the electrode layer 12. The mutual error difference of the spacing is the absolute value of the difference between the absolute value of the spacing X1 minus the spacing X2 and the absolute value of the spacing X3 minus the spacing X4 (||spacing X1−spacing X2|−|spacing X3−spacing X4||). The units are micrometers (μm). FIG. 9 illustrates the results of measuring the mutual error difference for thirty samples of each of the reference example and the embodiment. As illustrated in FIG. 9, for the ceramic dielectric substrate according to the reference example, the mutual error difference is not less than about 235 micrometers and not more than about 525 micrometers. On the other hand, for the ceramic dielectric substrate 11 according to the embodiment, the mutual error difference is not less than 0 micrometers and not more than 200 micrometers.

Thus, in the embodiment, the mutual error difference of the spacing between the ceramic dielectric substrate 11 and the electrode layer 12 can be extremely small. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 10:
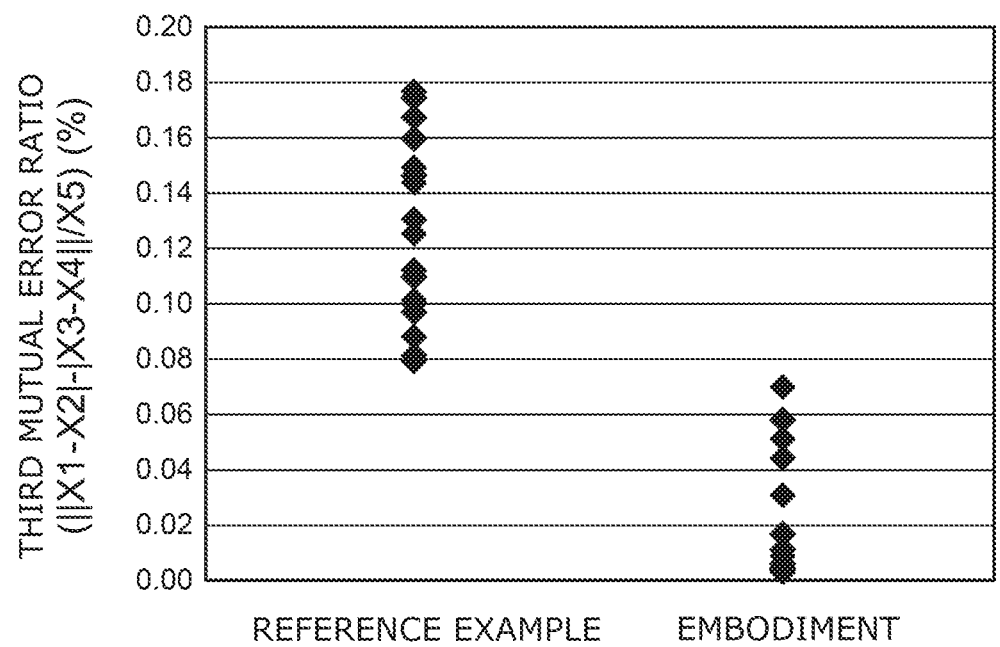
FIG. 10 illustrates a third mutual error ratio of the spacing of the electrode layer to the outer diameter of the ceramic dielectric substrate.

FIG. 10 illustrates a third mutual error ratio of the spacing of the electrode layer to the outer diameter of the ceramic dielectric substrate.

The third mutual error ratio of the spacing of the electrode layer 12 to the outer diameter of the ceramic dielectric substrate 11 will now be described with reference to FIG. 6. FIG. 10 illustrates the ratio (hereinbelow, called simply the "third mutual error ratio") of the mutual error difference (||spacing X1−spacing X2|−|spacing X3−spacing X4||) to the spacing to the outer diameter X5 for the ceramic dielectric substrate according to the reference example and the third mutual error ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 10 is the third mutual error ratio of the spacing of the electrode layer 12 to the outer diameter of the ceramic dielectric substrate 11 (||spacing X1−spacing X2|−|spacing X3−spacing X4||/X5). The units are %. FIG. 10 illustrates the results of measuring the third mutual error ratio for thirty samples of each of the reference example and the embodiment. As illustrated in FIG. 10, for the ceramic dielectric substrate according to the reference example, the third mutual error ratio is not less than about 0.08% and not more than about 0.18%. On the other hand, for the ceramic dielectric substrate 11 according to the embodiment, the third mutual error ratio is not less than 0% and not more than 0.07%.

Thus, in the embodiment, the third mutual error ratio of the spacing of the electrode layer 12 to the outer diameter of the ceramic dielectric substrate 11 can be extremely small. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 11:
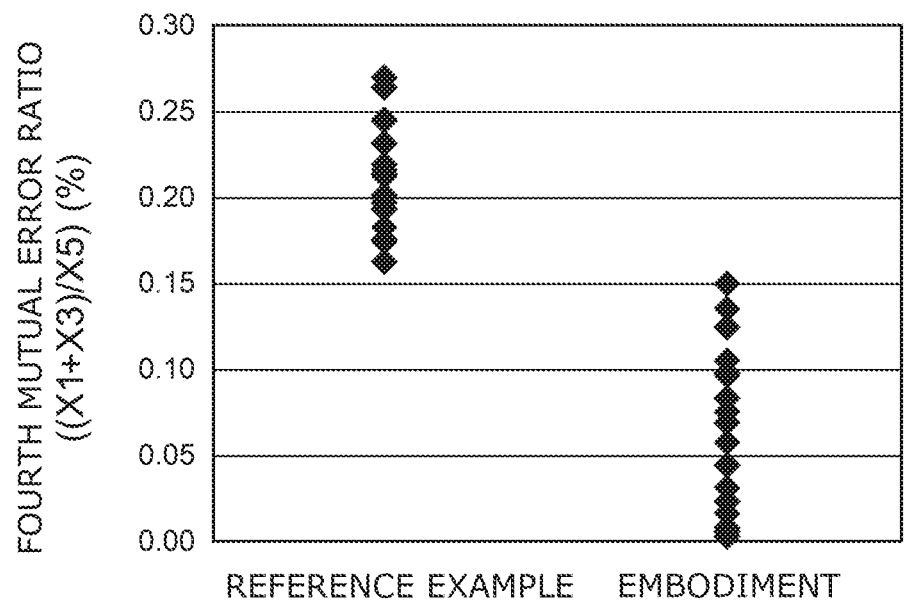
FIG. 11 illustrates a fourth mutual error ratio of the spacing of the electrode layer to the outer diameter of the ceramic dielectric substrate.

FIG. 11 illustrates a fourth mutual error ratio of the spacing of the electrode layer to the outer diameter of the ceramic dielectric substrate.

The fourth mutual error ratio of the spacing of the electrode layer 12 to the outer diameter of the ceramic dielectric substrate 11 will now be described with reference to FIG. 6. FIG. 11 illustrates the ratio (hereinbelow, called simply the "fourth mutual error ratio") of the absolute value of the spacing X1 plus the spacing X3 to the outer diameter X5 for the ceramic dielectric substrate according to the reference example and the fourth mutual error ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 11 is the fourth mutual error ratio of the spacing of the electrode layer 12 to the outer diameter of the ceramic dielectric substrate 11 (|spacing X1+spacing X3|/outer diameter X5). The units are %. FIG. 11 illustrates the results of measuring the fourth mutual error ratio for thirty samples of each of the reference example and the embodiment. As illustrated in FIG. 11, for the ceramic dielectric substrate according to the reference example, the fourth mutual error ratio is not less than about 0.16% and not more than about 0.27%. On the other hand, for the ceramic dielectric substrate 11 according to the embodiment, the fourth mutual error ratio is not less than 0% and not more than 0.15%.

Thus, in the embodiment, the fourth mutual error ratio can be extremely small. Thereby, using the outer diameter X5 of the electrode layer 12 as a reference, the electrode layer 12 can be formed up to a position extremely proximal to the outer perimeter 11$r$ of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13$a$. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 12:
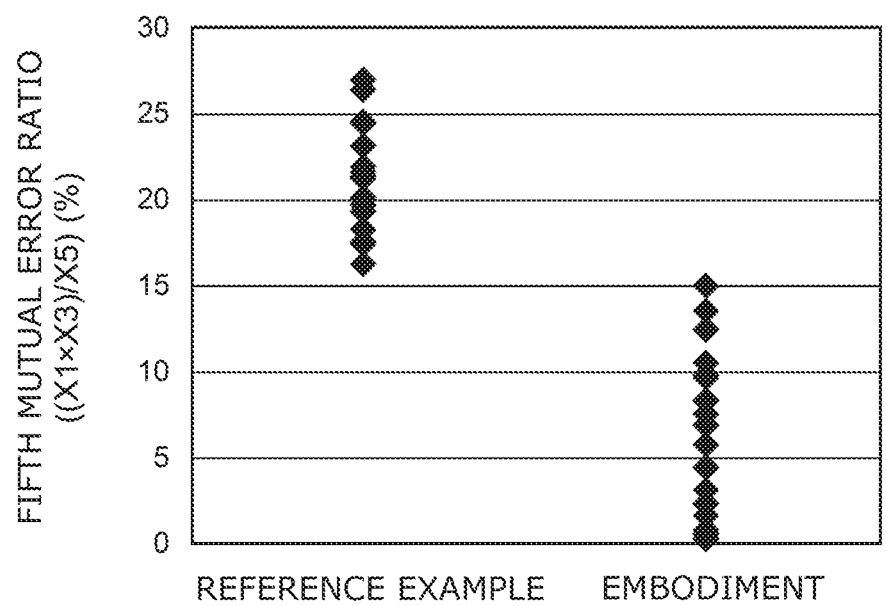
FIG. 12 illustrates a fifth mutual error ratio of the spacing of the electrode layer to the outer diameter of the ceramic dielectric substrate.

FIG. 12 illustrates a fifth mutual error ratio of the spacing of the electrode layer to the outer diameter of the ceramic dielectric substrate.

The fifth mutual error ratio of the spacing of the electrode layer 12 to the outer diameter of the ceramic dielectric substrate 11 will now be described with reference to FIG. 6. FIG. 12 illustrates the ratio (hereinbelow, called simply the "fifth mutual error ratio") of the absolute value of the spacing X1 times the spacing X3 to the outer diameter X5 for the ceramic dielectric substrate according to the reference example and the fifth mutual error ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 12 is the fifth mutual error ratio of the spacing of the electrode layer 12 to the outer diameter of the ceramic dielectric substrate 11 (|spacing X1×spacing X3|/outer diameter X5). The units are %. FIG. 12 illustrates the results of measuring the fifth mutual error ratio for thirty samples of each of the reference example and the embodiment. As illustrated in FIG. 12, for the ceramic dielectric substrate according to the reference example, the fifth mutual error ratio is not less than about 16% and not more than about 27%. On the other hand, for the ceramic dielectric substrate 11 according to the embodiment, the fifth mutual error ratio is 15% or less.

Thus, in the embodiment, the fifth mutual error ratio of the spacing of the electrode layer 12 to the outer diameter of the ceramic dielectric substrate 11 can be extremely small. Thereby, using the outer diameter X5 of the electrode layer 12 as a reference, the electrode layer 12 can be formed up to a position extremely proximal to the outer perimeter 11$r$ of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13$a$. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 13:
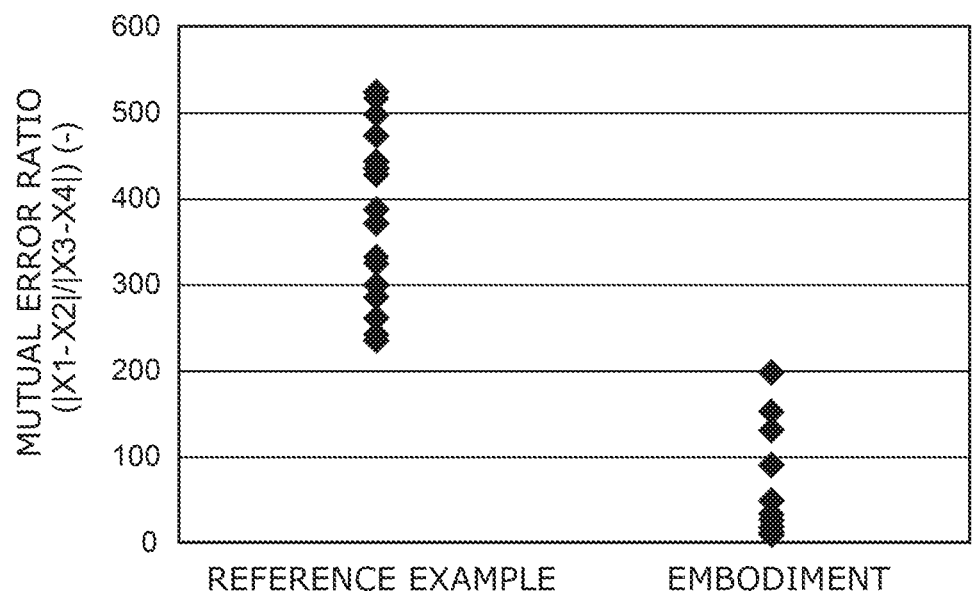
FIG. 13 illustrates the ratio of the mutual error of the spacing between the ceramic dielectric substrate and the electrode layer.

FIG. 13 illustrates the ratio of the mutual error of the spacing between the ceramic dielectric substrate and the electrode layer.

The ratio of the mutual error of the spacing between the ceramic dielectric substrate 11 and the electrode layer 12 will now be described with reference to FIG. 6. FIG. 13 illustrates the ratio of the mutual error of the spacing for the ceramic dielectric substrate according to the reference example and the ratio of the mutual error of the spacing for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 13 is the ratio of the mutual error of the spacing between the ceramic dielectric substrate 11 and the electrode layer 12. The ratio of the mutual error of the spacing is the ratio of the absolute value of the spacing X1 minus the spacing X2 to the absolute value of the spacing X3 minus the spacing X4 (|spacing X1−spacing X2|/|spacing X3−spacing X4|). There are no units. That is, the ratio of the mutual error of the spacing is a dimensionless number. FIG. 13 illustrates the results of measuring the ratio of the mutual error for thirty samples of each of the reference example and the embodiment. As illustrated in FIG. 13, for the ceramic dielectric substrate according to the reference example, the ratio of the mutual error is not less than about 230 and not more than about 520. On the other hand, for the ceramic dielectric substrate 11 according to the embodiment, the ratio of the mutual error is not less than 0 and not more than 200.

Thus, in the embodiment, the ratio of the mutual error can be extremely small. Thereby, using the outer diameter X5 of the electrode layer 12 as a reference, the electrode layer 12 can be formed up to a position extremely proximal to the outer perimeter 11$r$ of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13$a$. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 14:
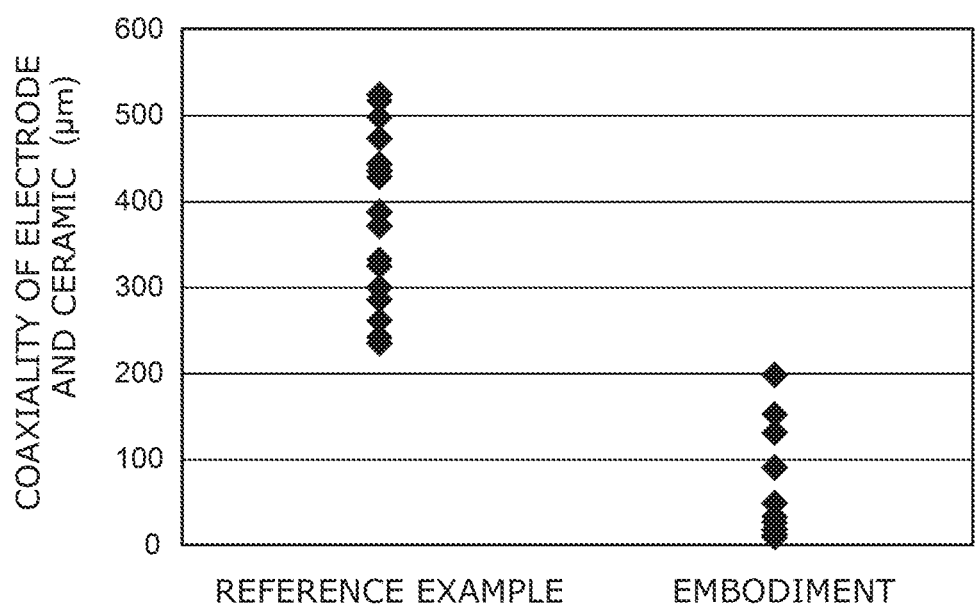
FIG. 14 illustrates the coaxiality between the electrode layer and the ceramic dielectric substrate.

FIG. 14 illustrates the coaxiality between the electrode layer and the ceramic dielectric substrate.

The coaxiality between the electrode layer and the ceramic dielectric substrate will now be described with reference to FIG. 4. FIG. 14 illustrates the coaxiality between the electrode layer and the ceramic dielectric substrate for the ceramic dielectric substrate according to the reference example and the coaxiality between the electrode layer and the ceramic dielectric substrate for the ceramic dielectric substrate 11 according to the embodiment. The coaxiality between the electrode layer and the ceramic dielectric substrate (hereinbelow, called simply the "coaxiality") refers to the shift amount between the center position of the electrode layer and the center position of the ceramic dielectric substrate. In the ceramic dielectric substrate according to the reference example, only the contraction of the ceramic dielectric substrate and the electrode layer when sintering is adjusted.

The vertical axis of FIG. 14 is the coaxiality. The units are micrometers (μm). FIG. 14 illustrates the results of measuring the coaxiality for thirty samples of each of the reference example and the embodiment. In the reference example as illustrated in FIG. 14, the coaxiality is not less than about 230 micrometers and not more than about 520 micrometers. On the other hand, in the embodiment, the coaxiality is 200 micrometers or less.

In FIG. 14, the coaxiality described above is measured for the electrode layer within 3 millimeters (mm) from the outer diameter of the ceramic dielectric substrate.

Thus, in the embodiment, the coaxiality of the ceramic dielectric substrate 11 and the electrode layer 12 can be extremely small. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Modifications of the ceramic dielectric substrate and the electrode layer will now be described with reference to the drawings.

Figure 15A:
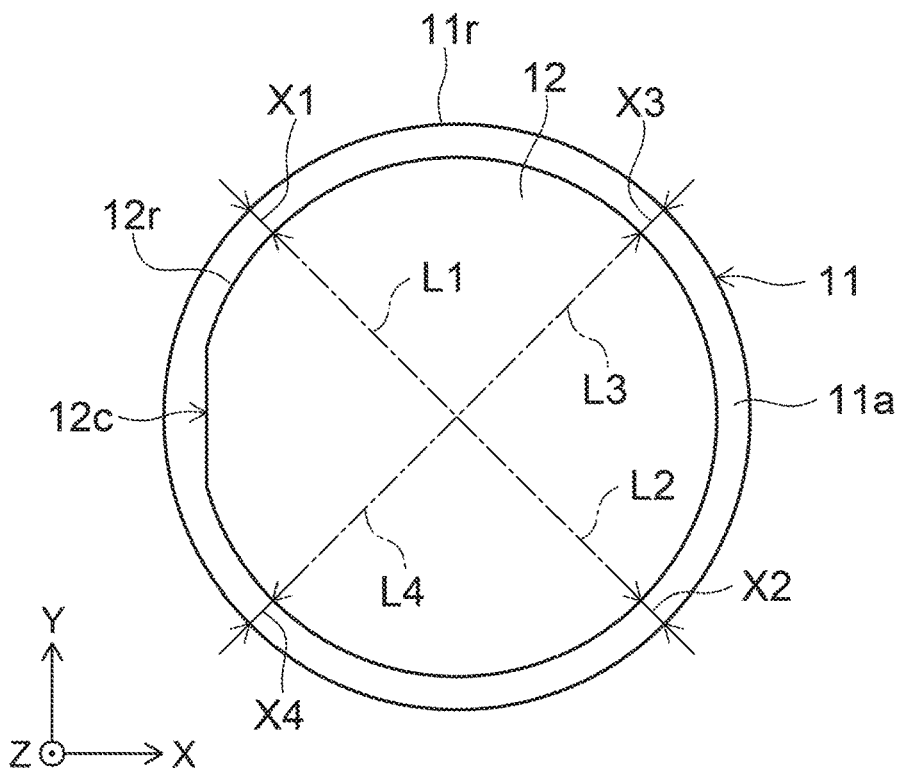
FIGS. 15A and 15B are schematic plan views illustrating modifications of the ceramic dielectric substrate and the electrode layer.
Figure 15B:
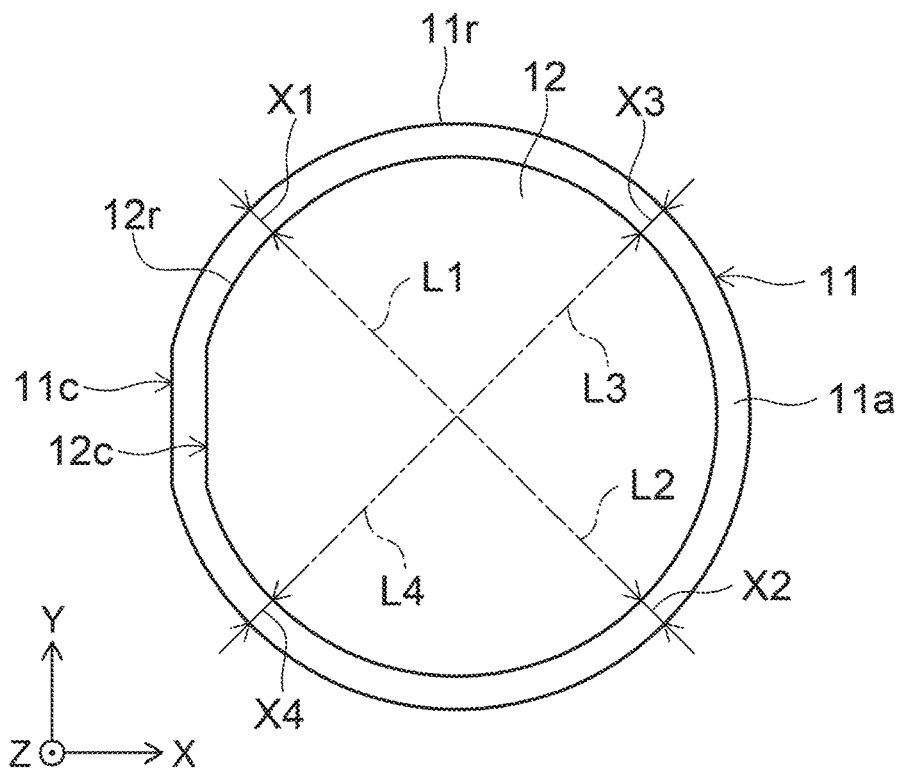

FIGS. 15A and 15B are schematic plan views illustrating modifications of the ceramic dielectric substrate and the electrode layer.

FIG. 15A is a schematic plan view describing a modification of the electrode layer. FIG. 15B is a schematic plan view describing a modification of the ceramic dielectric substrate.

As illustrated in FIG. 15A, an orientation flat (an orientation flat) portion 12c may be provided in a portion of the outer perimeter 12r of the electrode layer 12. In such a case, the spacing d described above in reference to FIG. 2A, the spacing d1 and the spacing d2 described above in reference to FIG. 2B, the spacing d1 and the spacing d2 described above in reference to FIG. 3, the spacing X1, the spacing X2, the spacing X3, and the spacing X4 described above in reference to FIG. 4, and the spacing X1, the spacing X2, the spacing X3, and the spacing X4 described above in reference to FIG. 6 are taken to be spacings measured at portions other than the portion where the orientation flat portion 12c is provided.

As illustrated in FIG. 15B, an orientation flat portion 11c may be provided in a portion of the outer perimeter 11r of the ceramic dielectric substrate 11; and the orientation flat portion 12c may be provided in a portion of the outer perimeter 12r of the electrode layer 12. In such a case, the spacing d described above in reference to FIG. 2A, the spacing d1 and the spacing d2 described above in reference to FIG. 2B, the spacing d1 and the spacing d2 described above in reference to FIG. 3, the spacing X1, the spacing X2, the spacing X3, and the spacing X4 described above in reference to FIG. 4, and the spacing X1, the spacing X2, the spacing X3, and the spacing X4 described above in reference to FIG. 6 are taken to be spacings measured at portions other than the portions where the orientation flat portion 11c and the orientation flat portion 12c are provided.

Figure 16:
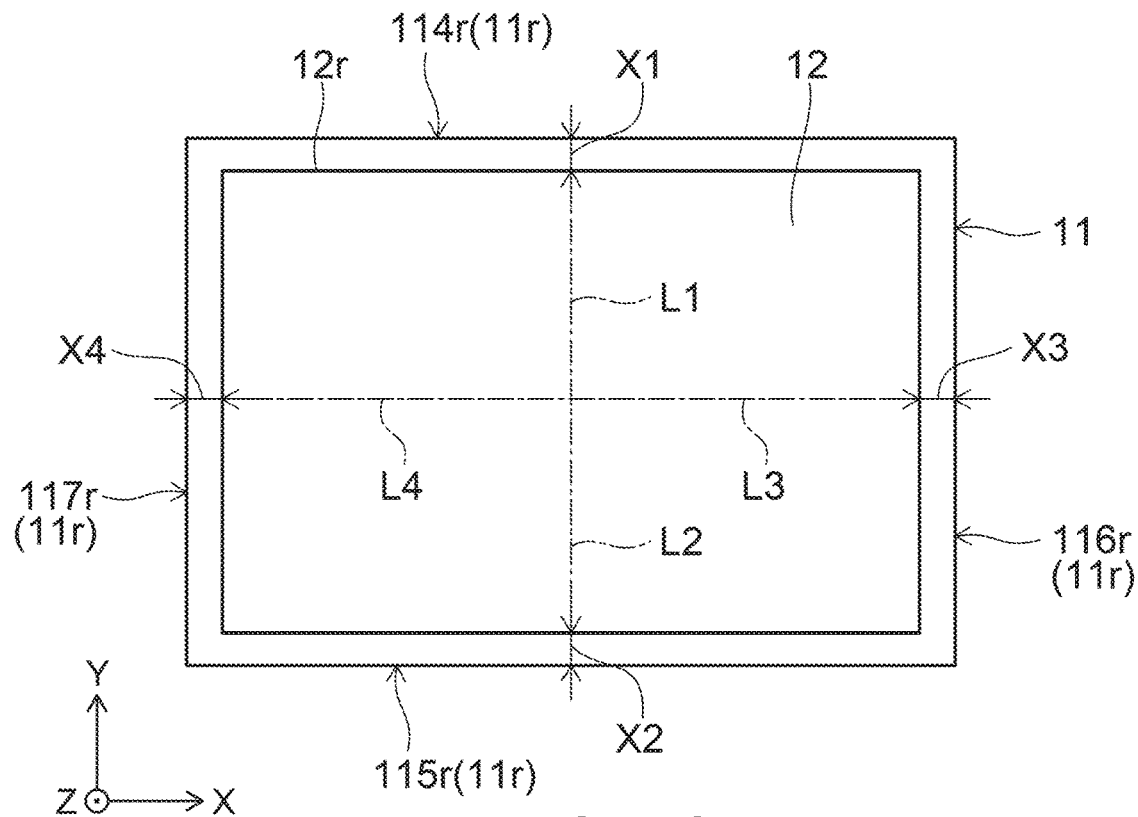
FIG. 16 is a schematic plan view illustrating another modification of the ceramic dielectric substrate and the electrode layer.

FIG. 16 is a schematic plan view illustrating another modification of the ceramic dielectric substrate and the electrode layer.

As illustrated in FIG. 16, the ceramic dielectric substrate 11 may be a rectangle when viewed from the Z-direction. Also, the electrode layer 12 may be a rectangle when viewed from the Z-direction. In such a case, an imaginary line that extends perpendicularly to a first side 114r of the outer perimeter 11r from the position C of the center of the ceramic dielectric substrate 11 is taken as the first imaginary line L1. An imaginary line that extends perpendicularly to a second side 115r of the outer perimeter 11r from the position C of the center of the ceramic dielectric substrate 11 is taken as the second imaginary line L2. An imaginary line that extends perpendicularly to a third side 116r of the outer perimeter 11r from the position C of the center of the ceramic dielectric substrate 11 is taken as the third imaginary line L3. An imaginary line that extends perpendicularly to a fourth side 117r of the outer perimeter 11r from the position C of the center of the ceramic dielectric substrate 11 is taken as the fourth imaginary line L4.

The second side 115r is a side parallel to the first side 114r. The third side 116r is a side crossing the first side 114r and the second side 115r. The fourth side 117r is a side crossing the first side 114r and the second side 115r.

The spacing X1 described above in reference to FIG. 4 and FIG. 6 is taken as the spacing between the outer perimeter 12r of the electrode layer 12 and the outer perimeter 11r of the ceramic dielectric substrate 11 on the first imaginary line L1. The spacing X2 described above in reference to FIG. 4 and FIG. 6 is taken as the spacing between the outer perimeter 12r of the electrode layer 12 and the outer perimeter 11r of the ceramic dielectric substrate 11 on the second imaginary line L2. The spacing X3 described above in reference to FIG. 4 and FIG. 6 is taken as the spacing between the outer perimeter 12r of the electrode layer 12 and the outer perimeter 11r of the ceramic dielectric substrate 11 on the third imaginary line L3. The spacing X4 described above in reference to FIG. 4 and FIG. 6 is taken as the spacing between the outer perimeter 12r of the electrode layer 12 and the outer perimeter 11r of the ceramic dielectric substrate 11 on the fourth imaginary line L4.

Figure 17:
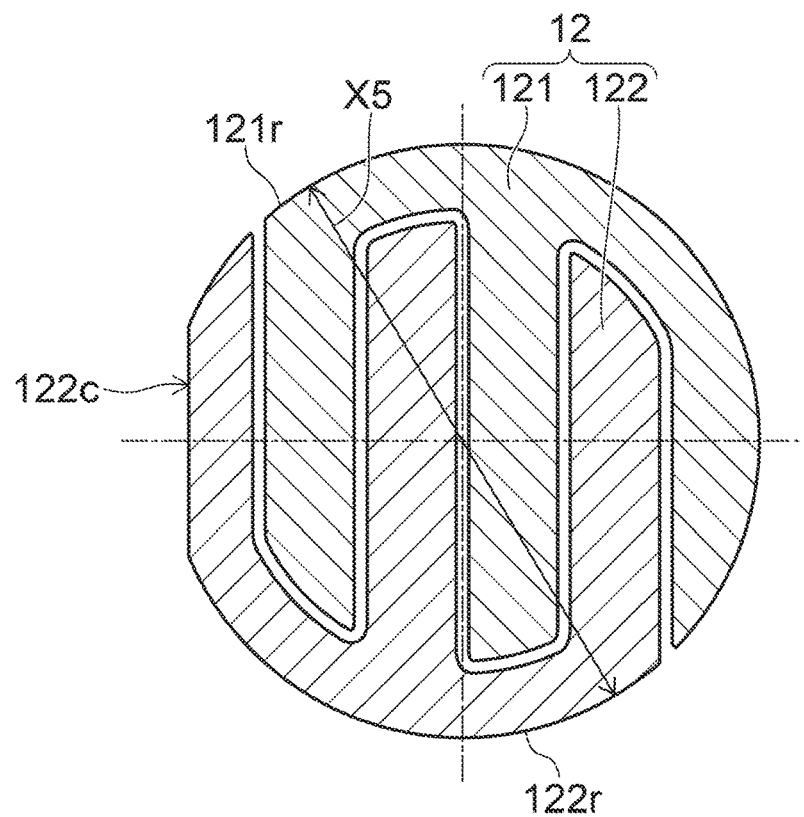
FIG. 17 is a schematic plan view illustrating another modification of the electrode layer.

FIG. 17 is a schematic plan view illustrating another modification of the electrode layer.

The electrode layer 12 illustrated in FIG. 17 is a dipolar electrode layer and includes the first electrode component 121 and the second electrode component 122. As illustrated in FIG. 17, the first electrode component 121 and the second electrode component 122 each have comb teeth configurations. The first electrode component 121 and the second electrode component 122 are arranged so that the comb teeth of the first electrode component 121 mesh with the comb teeth of the second electrode component 122.

An orientation flat portion 122c is provided in a portion of the second outer perimeter side 122r of the second electrode component 122. The orientation flat portion may be provided in the first electrode component 121 but not in the second electrode component 122.

In the electrode layer 12 illustrated in FIG. 17, the outer diameter X5 described above in reference to FIG. 6 corresponds to the outer diameter of at least one of the first outer perimeter side 121r of the first electrode component 121 or the second outer perimeter side 122r of the second electrode component 122. Thus, in the embodiment, the configuration of the electrode layer 12 is not particularly limited.

Figure 18:
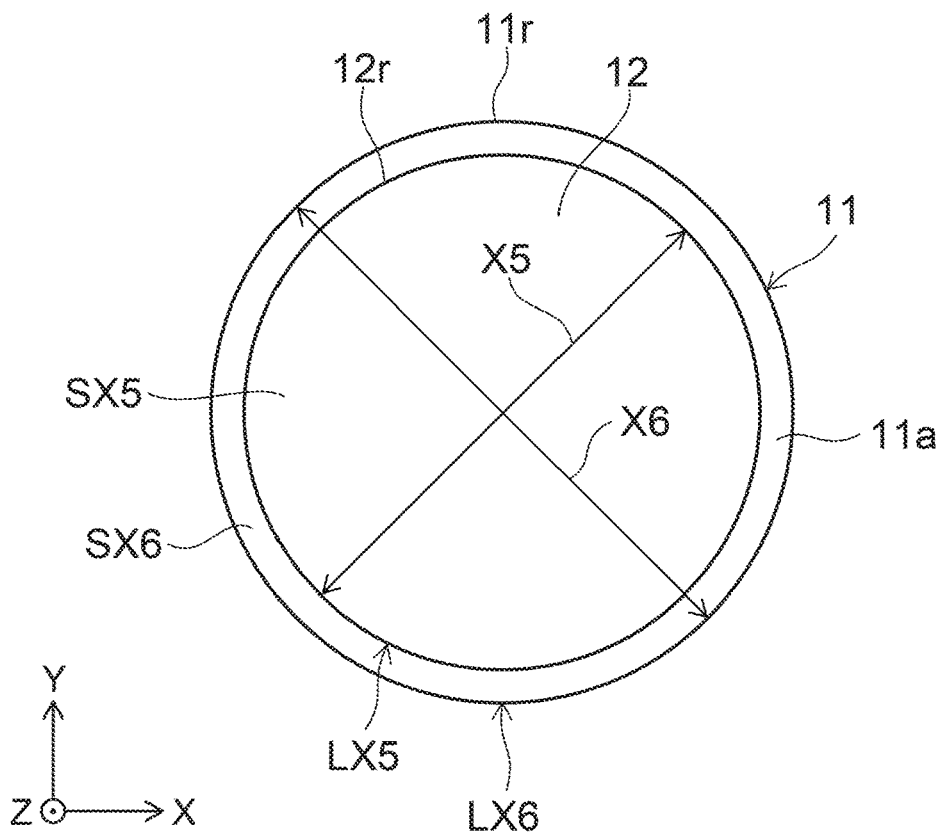
FIG. 18 is a schematic plan view illustrating a fourth arrangement of the ceramic dielectric substrate and the electrode layer.

FIG. 18 is a schematic plan view illustrating a fourth arrangement of the ceramic dielectric substrate and the electrode layer.

In FIG. 18, the exterior forms of the ceramic dielectric substrate 11 and the electrode layer 12 are illustrated by solid lines for convenience of description.

The electrode layer 12 illustrated in FIG. 18 is unipolar. The outer diameter of the outer perimeter 12r of the electrode layer 12 is taken as the outer diameter X5. Here, the outer diameter X5 is the outer diameter in the case where the outermost form of the electrode layer 12 is assumed to be a circle. In other words, the outer diameter X5 is the equivalent circle diameter of the outermost form of the electrode layer 12. The length of the outer perimeter 12r specified by the outer diameter X5 is taken as the circumference LX5. The surface area of a circle specified by the outer diameter X5 is taken as the surface area SX5.

The outer diameter of the outer perimeter 11r of the ceramic dielectric substrate 11 is taken as an outer diameter X6. The length of the outer perimeter 11r specified by the outer diameter X6 is taken as the circumference LX6. The surface area of a circle specified by the outer diameter X6 is taken as the surface area SX6.

Figure 19:
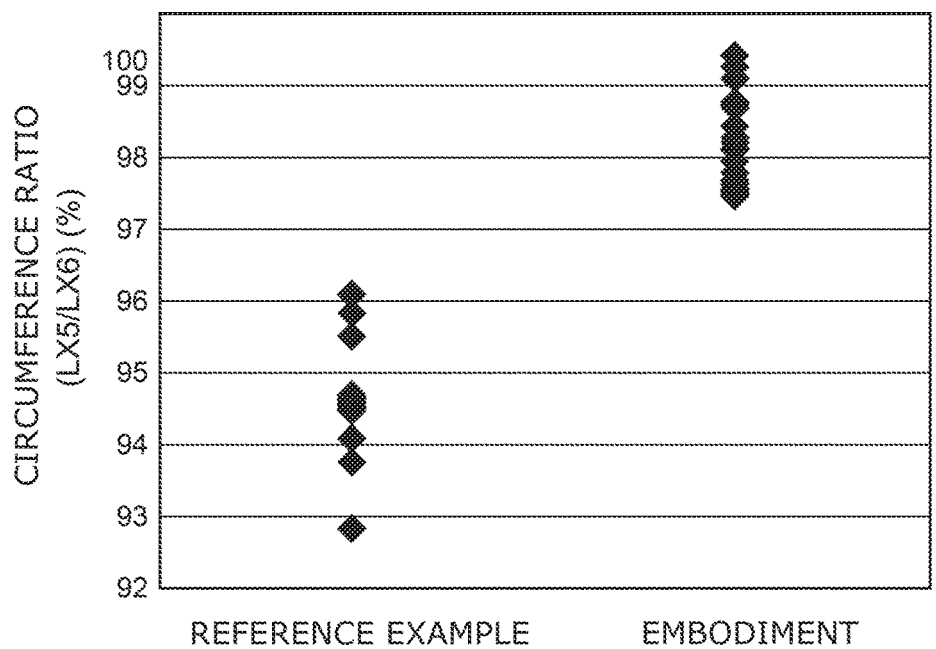
FIG. 19 illustrates the ratio of the outer perimeter lengths of the ceramic dielectric substrate and the electrode layer.

FIG. 19 illustrates the ratio of the outer perimeter lengths of the ceramic dielectric substrate and the electrode layer.

FIG. 19 illustrates the ratio of the circumference LX5 to the circumference LX6 (hereinbelow, called simply the "circumference ratio") for the ceramic dielectric substrate according to the reference example and the circumference ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 19 is the circumference ratio (LX5/LX6) of the ceramic dielectric substrate 11 and the electrode layer 12. The units are %. FIG. 19 illustrates the results of measuring the circumference ratio for thirty samples of each of the reference example and the embodiment. As illustrated in FIG. 19, for the ceramic dielectric substrate according to the reference example, the circumference ratio is not less than about 92.8% and not more than about 96.1%. On the other hand, for the ceramic dielectric substrate 11 according to the embodiment, the circumference ratio is not less than 97.4% and not more than 99.6%.

Thus, in the embodiment, the circumference ratio of the ceramic dielectric substrate 11 and the electrode layer 12 can be set to be extremely large. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 20:
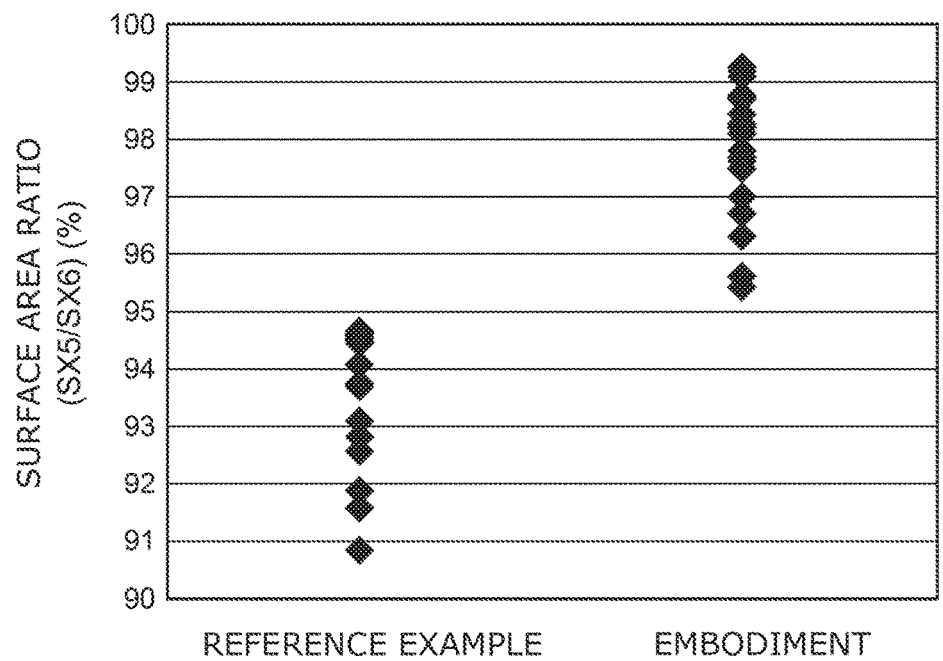
FIG. 20 illustrates the ratio of the surface areas of the ceramic dielectric substrate and the electrode layer.

FIG. 20 illustrates the ratio of the surface areas of the ceramic dielectric substrate and the electrode layer.

FIG. 20 illustrates the ratio of the surface area SX5 to the surface area SX6 (hereinbelow, called simply the "first surface area ratio") for the ceramic dielectric substrate according to the reference example and the first surface area ratio for the ceramic dielectric substrate 11 according to the embodiment. In the ceramic dielectric substrate according to the reference example, only the contraction of the ceramic dielectric substrate and the electrode layer when sintering is adjusted.

The vertical axis of FIG. 20 is the first surface area ratio (SX5/SX6) of the ceramic dielectric substrate 11 and the electrode layer 12. The units are %. FIG. 20 illustrates the results of measuring the first surface area ratio for thirty samples of each of the reference example and the embodiment. As illustrated in FIG. 20, for the ceramic dielectric substrate according to the reference example, the first surface area ratio is not less than about 90.8% and not more than about 94.6%. On the other hand, for the ceramic dielectric substrate 11 according to the embodiment, the first surface area ratio is not less than 95.1% and not more than 99.2%.

Thus, in the embodiment, the first surface area ratio of the ceramic dielectric substrate 11 and the electrode layer 12 can be set to be extremely large. Thereby, using the outer diameter X5 of the electrode layer 12 as a reference, the electrode layer 12 can be formed up to a position extremely proximal to the outer perimeter 11r of the ceramic dielectric substrate 11; the width of the dielectric provided on the outer side of the electrode layer 12 (a portion of the ceramic dielectric substrate 11) can be uniform; and it is possible to dispose the electrode layer 12 uniformly at the lower portion of the sealing ring 13a. Thereby, while maintaining the insulation breakdown voltage at the outer perimeter portion of the ceramic dielectric substrate 11, a uniform chucking force can be obtained over a wide area of the processing object; and the temperature distribution of the processing object when chucked can be set to be uniform.

Figure 21:
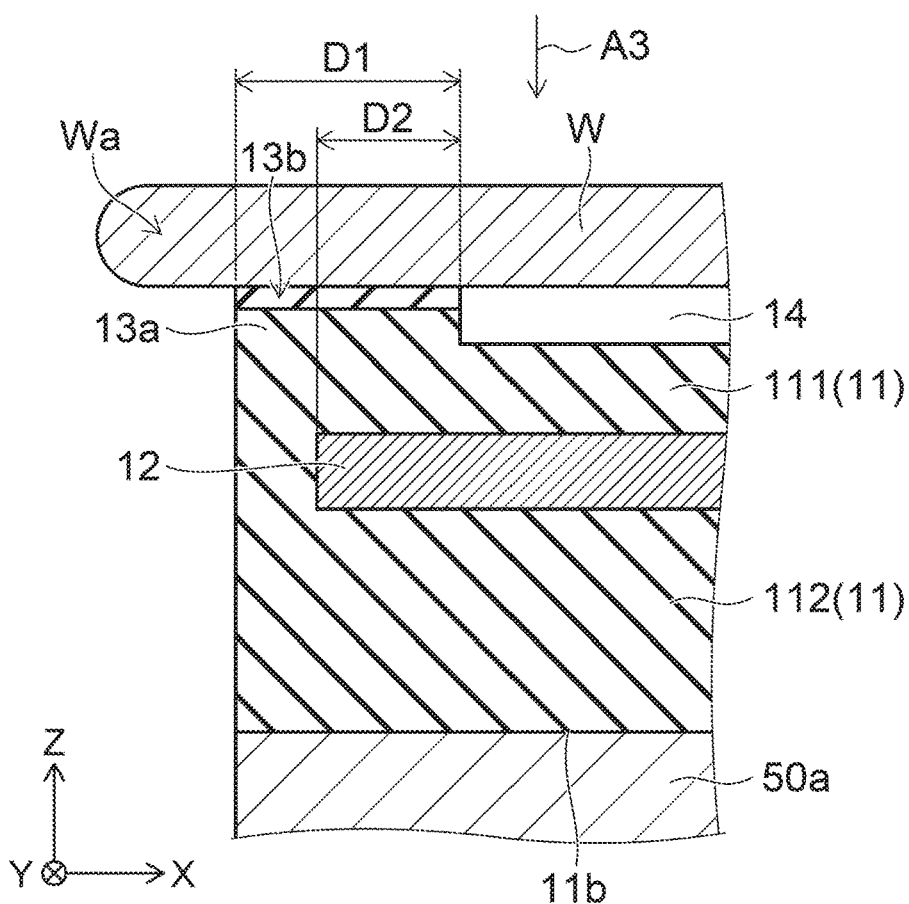
FIG. 21 is an enlarged schematic view in which region A1 illustrated in FIG. 1 is enlarged.

FIG. 21 is an enlarged schematic view in which region A1 illustrated in FIG. 1 is enlarged.

As described above in reference to FIG. 1, the electrostatic chuck 110 according to the embodiment is, for example, a Coulomb-type electrostatic chuck. In the Coulomb-type electrostatic chuck, the chucking force is generated only on the electrode layer 12. Therefore, it is desirable to dispose the electrode layer 12 up to a position proximal to the outer perimeter 11r of the ceramic dielectric substrate 11.

Here, in the embodiment as described above in reference to FIG. 3, FIG. 5, FIG. 7, FIG. 8 to FIG. 14, FIG. 19, and FIG. 20, the electrode layer 12 can be formed up to a position extremely proximal to the outer perimeter 11r of the ceramic dielectric substrate 11. Therefore, a width D1 of the protrusion 13 (the sealing ring 13a) provided in the peripheral edge portion of the ceramic dielectric substrate 11 can be set to be smaller. The sealing ring 13a suppresses the transfer gas such as helium (He) or the like leaking from the space provided between the processing object W and the grooves 14.

The surface area where the processing object W contacts the sealing ring 13a decreases as the width D1 of the sealing ring 13a decreases. Thereby, the overall wear amount due to the friction between the sealing ring 13a and the processing object W when using the electrostatic chuck 110 can be suppressed. Thereby, the change over time of the sealing ring 13a can be suppressed. The particles adhering to the processing object W also can be suppressed.

Because the wear due to the friction between the surface of the sealing ring 13a and the processing object W can be suppressed, the transfer gas such as helium (He) or the like leaking from the space provided between the processing object W and the grooves 14 can be suppressed further. That is, the fluctuation of the leakage amount of the transfer gas such as helium (He) or the like occurring due to the manufacturing fluctuation of the sealing ring 13a can be suppressed; and the control of the sealing ring 13a can be performed more easily.

Also, the chucking of the processing object W at the portion where the sealing ring 13a is provided can be stabilized. Accordingly, the state in which the temperature of the processing object W does not change can be maintained through the processes. Thereby, a uniform chucking force can be obtained over a wide area of the processing object W; and the temperature distribution of the processing object W when chucked can be set to be uniform.

The sealing ring 13a will now be described further with reference to the drawings.

Figure 22A:
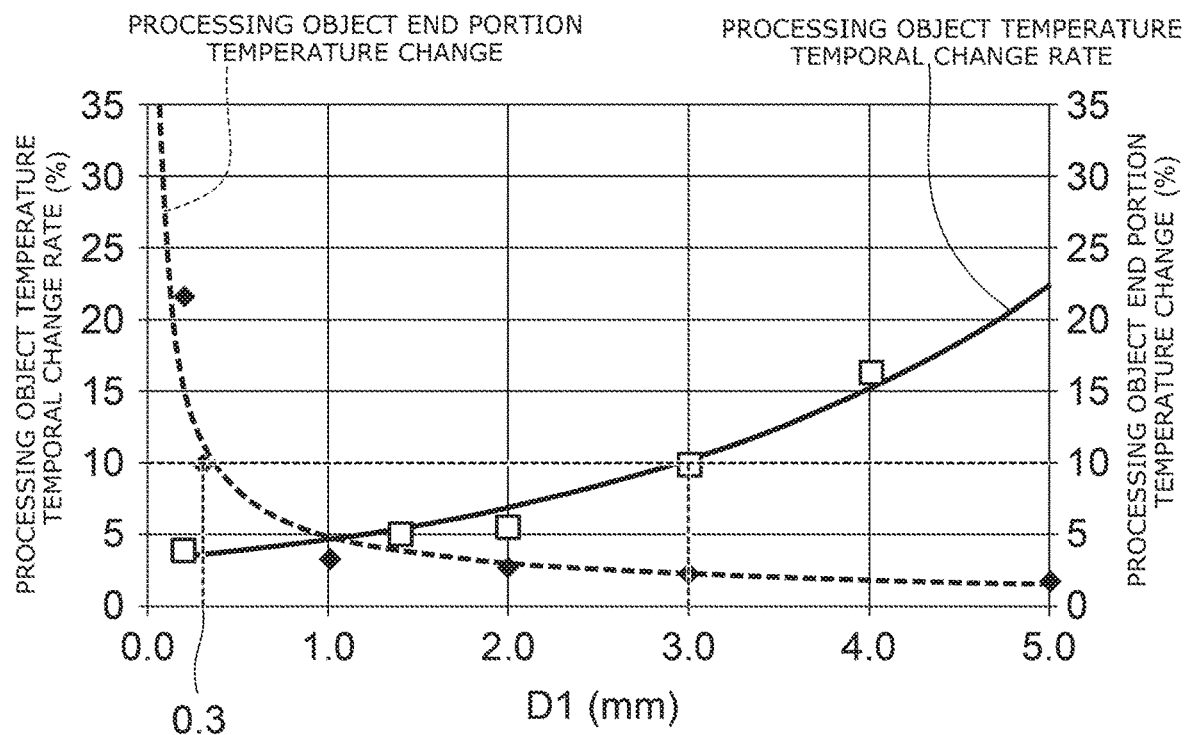
FIGS. 22A and 22B are graphs illustrating the relationship between the width of the sealing ring and the temporal change rate of the temperature of the processing object and the relationship between the width of the sealing ring and the temperature change of the end portion of the processing object.
Figure 22B:
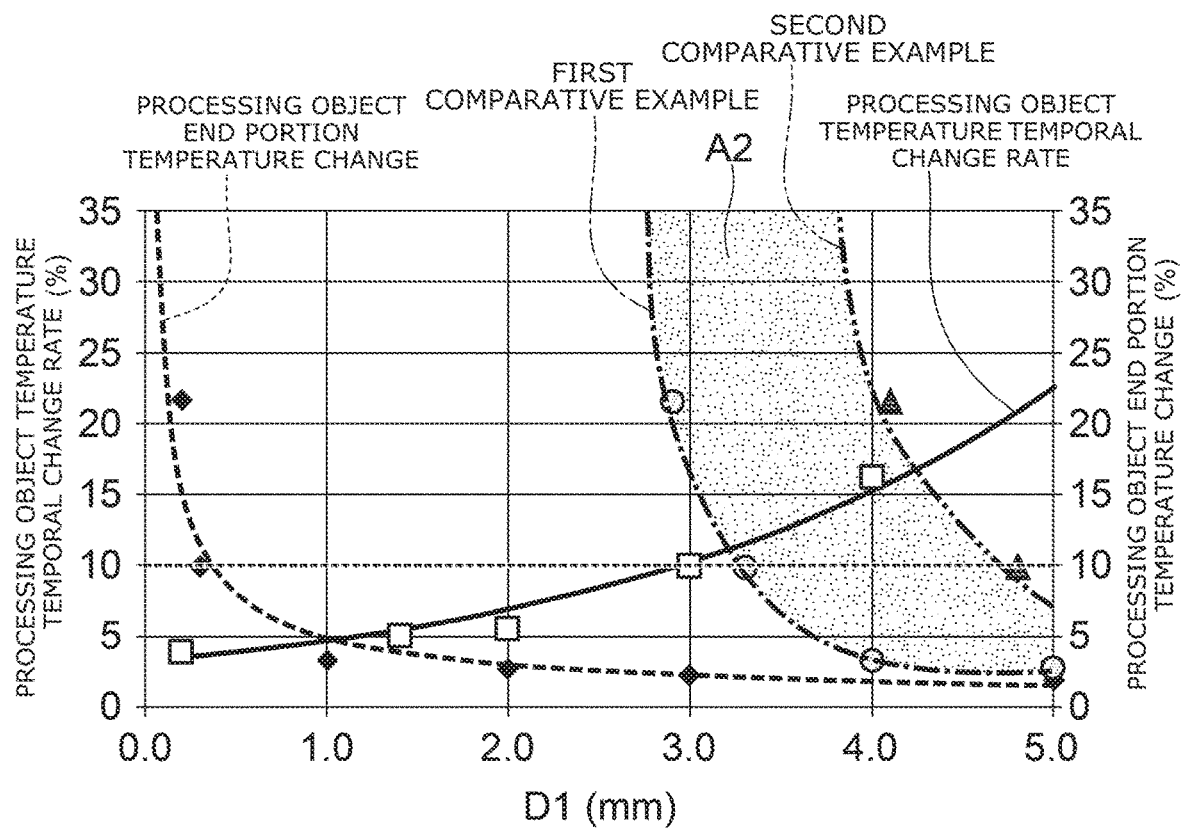

FIGS. 22A and 22B are graphs illustrating the relationship between the width of the sealing ring and the temporal change rate of the temperature of the processing object and the relationship between the width of the sealing ring and the temperature change of the end portion of the processing object.

FIG. 22A is a graph illustrating the relationship between the width of the sealing ring and the temporal change rate of the temperature of the processing object and the relationship between the width of the sealing ring and the temperature change of the end portion of the processing object for the electrostatic chuck according to the embodiment. FIG. 22B is a graph illustrating the relationship between the width of the sealing ring and the temporal change rate of the temperature of the processing object and the relationship between the width of the sealing ring and the temperature change of the end portion of the processing object for the electrostatic chuck according to the embodiment and an electrostatic chuck according to a comparative example.

In the graphs illustrated in FIG. 22A and FIG. 22B, the horizontal axis is the width D1 (mm) of the sealing ring 13a. In the graphs illustrated in FIG. 22A and FIG. 22B, the left vertical axis is the temporal change rate (%) of the temperature of the processing object W. In the graphs illustrated in FIG. 22A and FIG. 22B, the right vertical axis is the temperature change (%) of the end portion of the processing object W.

FIG. 22A and FIG. 22B are graphs after 100 hours from the processing start. In FIG. 22A and FIG. 22B, the difference (D1−D2) between the overlap distance D2 and the width D1 of the sealing ring 13a is assumed to be 1.0 millimeters. The details of the overlap distance D2 are described below.

The "temporal change rate of the temperature of the processing object W" refers to the change of the temperature of the processing object W due to the change of the heat transfer coefficient due to the change of the surface state of a contact surface 13b of the sealing ring 13a with the processing object W (referring to FIG. 21) under a plasma environment under the usage conditions of the electrostatic chuck 110. Or, the "temporal change rate of the temperature of the processing object W" refers to the ratio between the average temperature of the central portion of the processing object W and the temperature of a portion Wa (the end portion or the outer perimeter portion) of the processing object W jutting outside the sealing ring 13a.

The "temperature change of the end portion of the processing object W" refers to the change of the effect of suppressing the temperature increase of the portion Wa of the processing object W jutting outside the sealing ring 13a according to the width D1 of the sealing ring 13a. Or, the "temperature change of the end portion of the processing object W" refers to the increase rate of the temperature of the portion Wa of the processing object W to the average temperature of the central portion of the processing object W.

As illustrated in FIG. 22A and FIG. 22B, because the width D1 of the sealing ring 13a is relatively small and the surface area of the contact surface 13b of the sealing ring 13a is relatively narrow, the temporal change rate of the temperature of the processing object W when the heat transfer coefficient of the contact surface 13b changes is relatively small. Because the contact surface area between the contact surface 13b and the processing object W also is small in the case where the width D1 of the sealing ring 13a is relatively small, the amount of the adhered particles also can be low. On the other hand, because the surface area of the contact surface 13b is relatively wide in the case where the width D1 of the sealing ring 13a is relatively large, the temperature increase of the portion Wa of the processing object W is relatively low. Therefore, if the width D1 of the sealing ring 13a is relatively large, the temperature change of the end portion of the processing object W is relatively small; but the particle amount adhering to the processing object W undesirably increases because the contact surface area between the contact surface 13b and the processing object W increases.

In the case where the width D1 of the sealing ring 13a is wide, the dielectric surface which is the contact surface with the wafer in the processes is consumed easily by plasma; the wafer temperature fluctuates due to the change of the dielectric surface state; and the gas flow rate that is sealed between the dielectric surface and the wafer changes. Thereby, the assumed life of the electrostatic chuck may undesirably shorten.

Considering the lower limit of the tolerable value to which the processing object W can be cooled and the boundary to which the heat transfer coefficient between the processing object W and the ceramic dielectric substrate 11 is changeable, the inventor set, as a threshold, the ratio between the average temperature of the central portion of the processing object W and the temperature of the portion Wa of the processing object W to be 10% or less. According to knowledge obtained by the inventor, change over time occurs more easily for the portion Wa of the processing object W than for the central portion of the processing object W. In the case where the ratio between the average temperature of the central portion of the processing object W and the temperature of the portion Wa of the processing object W is 10% or less, the decrease of the yield of the processes of the processing object W can be suppressed. In the case where the increase rate of the temperature of the portion Wa of the processing object W to the average temperature of the central portion of the processing object W is 10% or less, the decrease of the yield of the processes of the processing object W can be suppressed.

Thereby, as illustrated in FIG. 22A and FIG. 22B, the width D1 of the sealing ring 13a is not less than 0.3 millimeters and not more than 3.0 millimeters. Within the width D1 of the sealing ring 13a that is not less than 0.3 millimeters and not more than 3.0 millimeters, a C-surface (a chamfer) having a maximum 1 millimeter is included in the end portion of the sealing ring 13a.

The difference (D1−D2) for the electrostatic chucks according to the first comparative example and the second comparative example illustrated in FIG. 22B is larger than the difference (D1−D2) of the electrostatic chuck 110 according to the embodiment. In such a case, as illustrated in FIG. 22B, the temperature change of the portion Wa of the processing object W for the electrostatic chucks according to the first comparative example and the second comparative example is larger than the temperature change of the portion Wa of the processing object W of the electrostatic chuck 110 according to the embodiment. Region A2 illustrated in FIG. 22B illustrates the range of the temperature change of the portion Wa of the processing object W in the first comparative example and the second comparative example.

Thereby, compared to the electrostatic chucks according to the first comparative example and the second comparative example, the portion Wa of the processing object W can be cooled efficiently in the electrostatic chuck 110 according to the embodiment.

Figure 23:
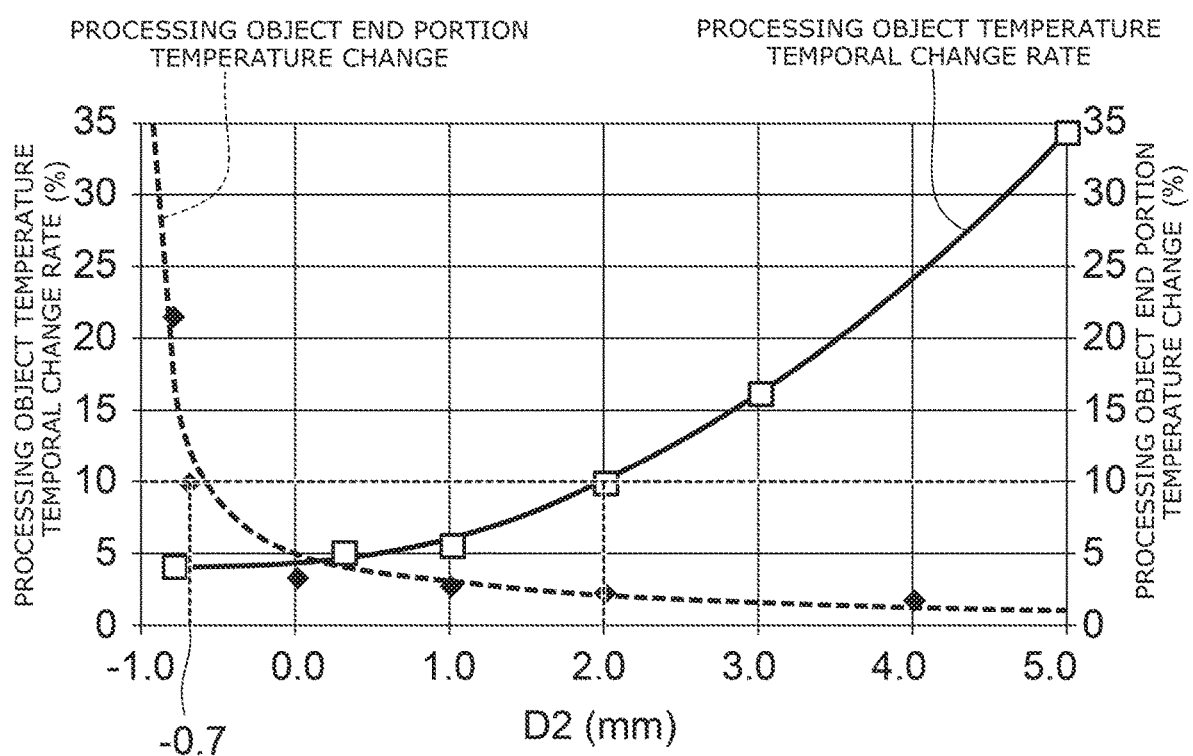
FIG. 23 is a graph illustrating the relationship between the overlap distance and the temporal change rate of the temperature of the processing object and the relationship between the overlap distance and the temperature change of the end portion of the processing object.

FIG. 23 is a graph illustrating the relationship between the overlap distance and the temporal change rate of the temperature of the processing object and the relationship between the overlap distance and the temperature change of the end portion of the processing object.

The horizontal axis of the graph illustrated in FIG. 23 is the overlap distance D2 (mm). The left vertical axis of the graph illustrated in FIG. 23 is the temporal change rate (%) of the temperature of the processing object W. The right vertical axis of the graph illustrated in FIG. 23 is the temperature change (%) of the end portion of the processing object W. The overlap distance D2 refers to the distance (the width) of the electrode layer 12 overlapping the sealing ring 13a when viewed in the Z-direction (referring to FIG. 21).

The "temporal change rate of the temperature of the processing object W" is as described above in reference to FIG. 22A and FIG. 22B. The "temperature change of the end portion of the processing object W" is as described above in reference to FIG. 22A and FIG. 22B.

As illustrated in FIG. 23, when the overlap distance D2 is relatively short, the surface area of the processing object W attracted and held by the sealing ring 13a is relatively narrow. Therefore, the force of the processing object W attracted and held by the sealing ring 13a is relatively weak; and the temporal change rate of the temperature of the processing object W is relatively small. On the other hand, when the overlap distance D2 is relatively long, the surface area of the processing object W attracted and held by the sealing ring 13a is relatively wide. Therefore, the temperature increase of the portion Wa of the processing object W is relatively low. Therefore, when the overlap distance D2 is relatively long, the temperature change of the end portion of the processing object W is relatively small.

As described above in reference to FIG. 22A and FIG. 22B, the inventor set, as a threshold, the ratio between the average temperature of the central portion of the processing object W and the temperature of the portion Wa of the processing object W to be 10% or less.

Thereby, as illustrated in FIG. 23, the overlap distance D2 is not less than −0.7 millimeters and not more than 2.0 millimeters. A negative overlap distance D2 illustrates the state in which the electrode layer 12 is separated from the sealing ring 13a without overlapping the sealing ring 13a when viewed in the Z-direction.

Figure 24A:
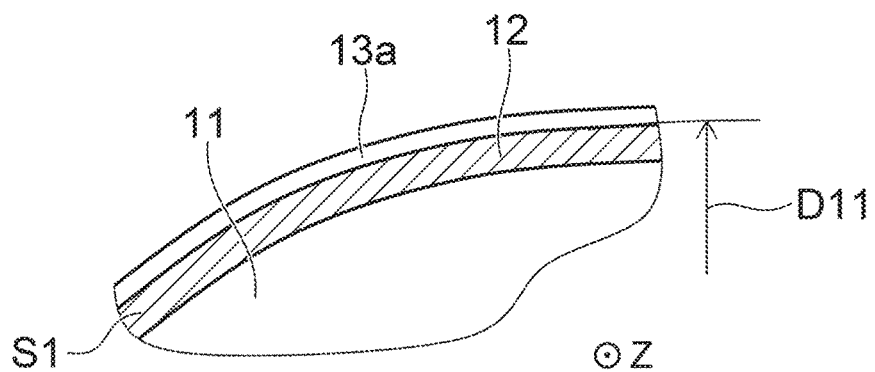
FIGS. 24A to 24C are schematic plan views when the peripheral edge portion of the ceramic dielectric substrate is viewed from the direction of arrow A3 illustrated in FIG. 21.
Figure 24B:
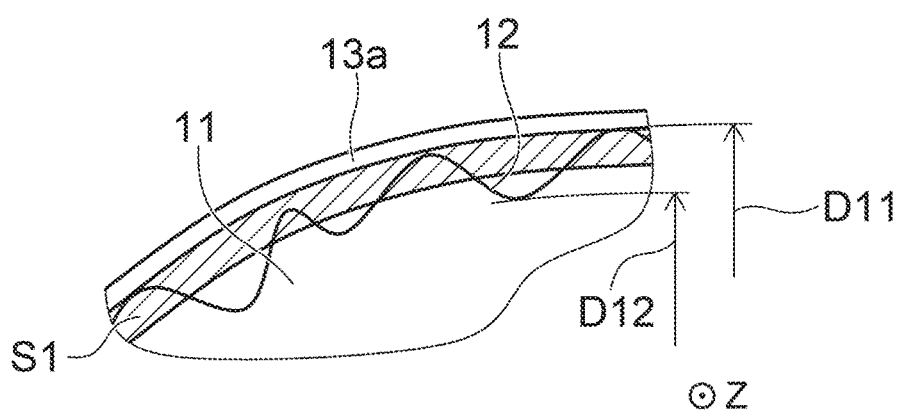
Figure 24C:
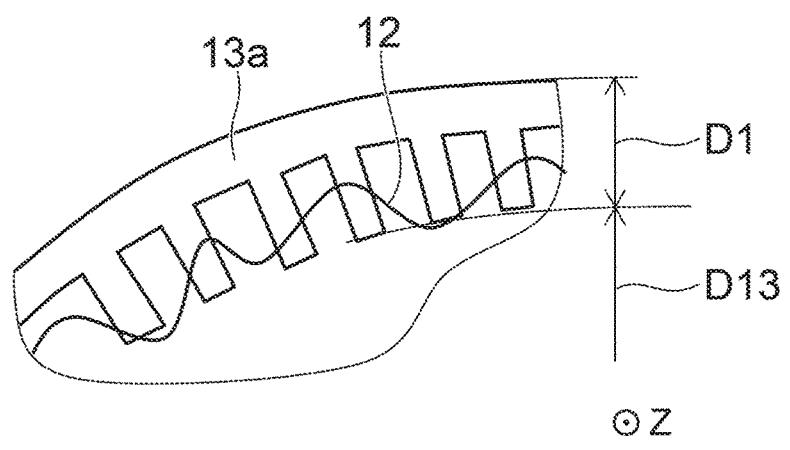

FIGS. 24A to 24C are schematic plan views when the peripheral edge portion of the ceramic dielectric substrate is viewed from the direction of arrow A3 illustrated in FIG. 21.

FIG. 24A is a schematic plan view describing the surface area of the region where the electrode layer 12 overlaps the sealing ring 13a. FIG. 24B is a schematic plan view describing the outer diameter of the electrode layer 12. FIG. 24C is a schematic plan view describing the inner diameter of the sealing ring 13a.

In FIG. 24A to FIG. 24C, the exterior forms of the ceramic dielectric substrate 11 and the electrode layer 12 are illustrated by solid lines for convenience of description.

As illustrated in FIG. 24A, the outer diameter of the electrode layer 12 is taken as an outer diameter D11. The surface area of the region where the electrode layer 12 overlaps the sealing ring 13a is taken as the surface area S1. In the case where the electrode layer 12 does not overlap the sealing ring 13a, the surface area of the region between the end portion of the outer diameter of the electrode layer 12 and the end portion at the center of the sealing ring 13a is taken as a surface area −S1. The surface area (the total surface area) of the ceramic dielectric substrate 11 when viewed in the Z-direction is taken as the surface area S2.

Here, as illustrated in FIG. 24B, in the case where the end portion of the electrode layer 12 is not a circle, the equivalent circle diameter of the outermost form of the electrode layer 12 is taken as the first outer diameter D11. In the case where the end portion of the electrode layer 12 is not a circle, the equivalent circle diameter at a position on the innermost side of the end portion of the electrode layer 12 is taken as a second outer diameter D12.

As illustrated in FIG. 24C in the case where the end portion on the inner side of the sealing ring 13a is not a circle, the equivalent circle diameter at a position on the innermost side of the end portion on the inner side of the sealing ring 13a is taken as an inner diameter D13.

As illustrated in FIG. 24B, in the case where the end portion of the electrode layer 12 is not a circle, the region that is surrounded with the first outer diameter D11 and the second outer diameter D12 is calculated. Continuing, the surface area of the region where the region surrounded with the first outer diameter D11 and the second outer diameter D12 overlaps the sealing ring 13a is calculated. As illustrated in FIG. 24C, in the case where the end portion on the inner side of the sealing ring 13a is not a circle, the surface area of the region where the region surrounded with the first outer diameter D11 and the second outer diameter D12 overlaps the sealing ring 13a at a position outside the inner diameter D13 is calculated. Thus, the calculated surface area is taken as the surface area S1 described above.

In the case where the configuration of the electrode layer 12 is not a circle when viewed in the Z-direction (the case of an irregularly-shape electrode), the outer diameter D11 of the electrode layer 12 is measured using an ultrasonic flaw detector. The surface area S1 of the region where the electrode layer 12 overlaps the sealing ring 13a is calculated based on the outer diameter D11 measured using the ultrasonic flaw detector.

Figure 25A:
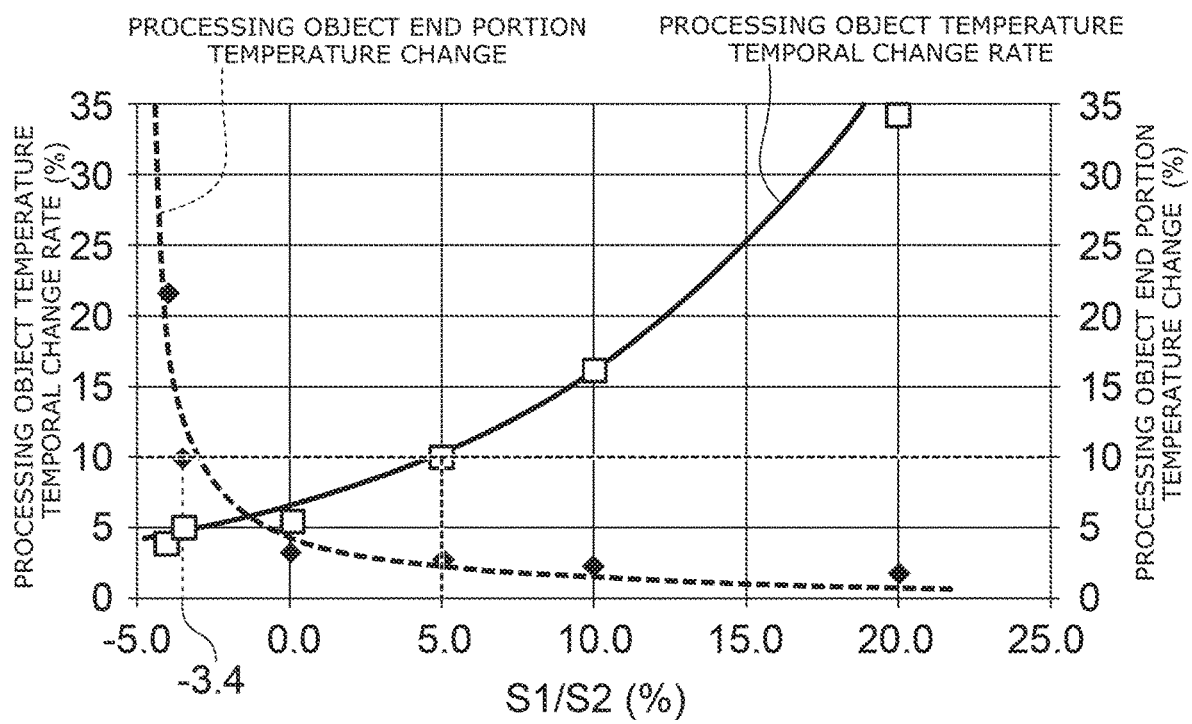
FIGS. 25A and 25B are graphs illustrating the relationship between a second surface area ratio of the ceramic dielectric substrate and the electrode layer and the temporal change rate of the temperature of the processing object and the relationship between the second surface area ratio and the temperature change of the end portion of the processing object.
Figure 25B:
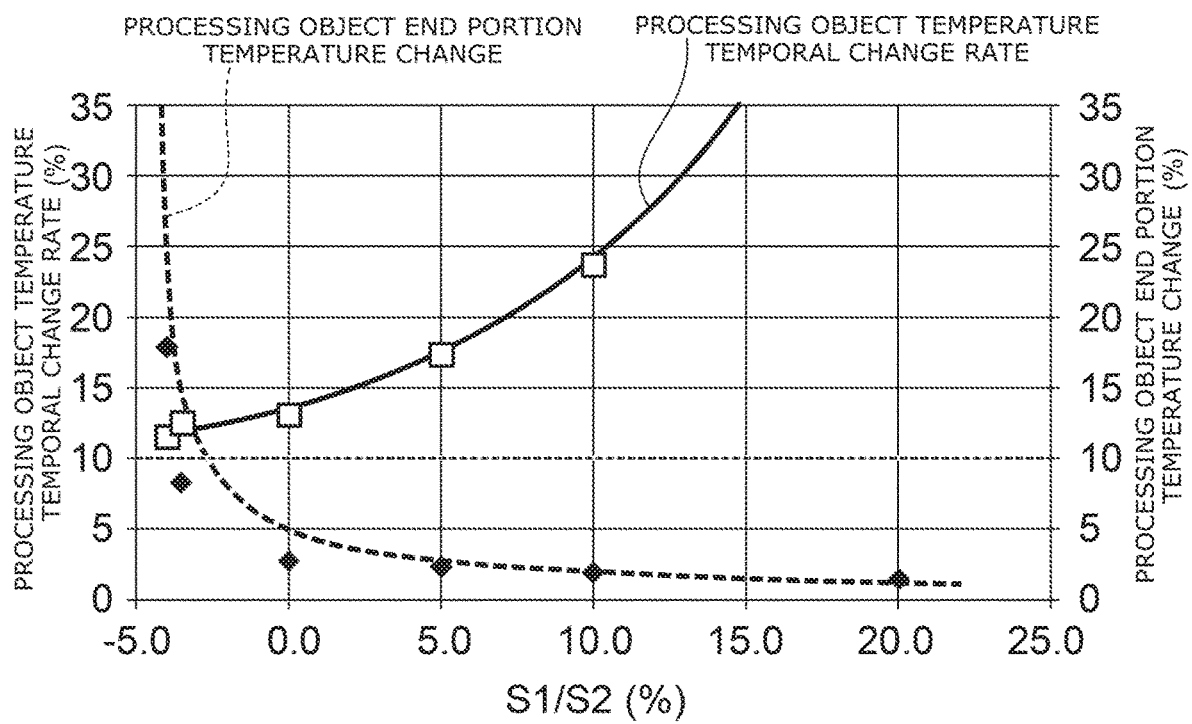

FIGS. 25A and 25B are graphs illustrating the relationship between a second surface area ratio of the ceramic dielectric substrate and the electrode layer and the temporal change rate of the temperature of the processing object and the relationship between the second surface area ratio and the temperature change of the end portion of the processing object.

FIG. 25A is a graph illustrating the relationship between the second surface area ratio of the ceramic dielectric substrate 11 and the electrode layer 12 and the temporal change rate of the temperature of the processing object and the relationship between the second surface area ratio and the temperature change of the end portion of the processing object for the electrostatic chuck according to the embodiment. FIG. 25B is a graph illustrating the relationship between the second surface area ratio and the temporal change rate of the temperature of the processing object and the relationship between the second surface area ratio and the temperature change of the end portion of the processing object for the electrostatic chuck according to the comparative example.

In the graphs illustrated in FIG. 25A and FIG. 25B, the horizontal axis is the ratio of the surface area S1 to the surface area S2 (hereinbelow, called simply the "second surface area ratio"). In the graphs illustrated in FIG. 25A and FIG. 25B, the left vertical axis is the temporal change rate (%) of the temperature of the processing object W. In the graphs illustrated in FIG. 25A and FIG. 25B, the right vertical axis is the temperature change (%) of the end portion of the processing object W.

The "temporal change rate of the temperature of the processing object W" is as described above in reference to FIG. 22A and FIG. 22B. The "temperature change of the end portion of the processing object W" is as described above in reference to FIG. 22A and FIG. 22B.

As illustrated in FIG. 25A and FIG. 25B, the surface area of the processing object W attracted and held by the sealing ring 13a is relatively narrow when the second surface area ratio (S1/S2) is relatively low. Therefore, the force of the processing object W attracted and held by the sealing ring 13a is relatively weak; and the temporal change rate of the temperature of the processing object W is relatively small. On the other hand, when the second surface area ratio (S1/S2) is relatively high, the chucking force of the processing object W acting on the sealing ring 13a increases; but because the chucking force becomes too large, the end portion of the processing object W undesirably becomes weak due to the change over time. However, the temperature change of the end portion of the processing object W is relatively small because a sufficient chucking force to suppress the temperature increase of the end portion of the processing object W is obtained.

As described above in reference to FIG. 22A and FIG. 22B, the inventor set, as a threshold, the ratio between the average temperature of the central portion of the processing object W and the temperature of the portion Wa of the processing object W to be 10% or less.

Thereby, as illustrated in FIG. 25A, the second surface area ratio (S1/S2) of the electrostatic chuck 110 according to the embodiment is not less than −3.4% and not more than 5%.

On the other hand, in the case where the surface area S1 of the electrostatic chuck according to the comparative example is set to be the same as the surface area S1 of the electrostatic chuck 110 according to the embodiment, it is necessary to set the width D1 of the sealing ring 13a to be large. Therefore, as illustrated in FIG. 25B, the temporal change rating of the temperature of the processing object W of the electrostatic chuck according to the comparative example is larger than the temporal change rate of the temperature of the processing object W of the electrostatic chuck 110 according to the embodiment. Therefore, in the comparative example illustrated in FIG. 25B, the ratio between the average temperature of the central portion of the processing object W and the temperature of the portion Wa of the processing object W is greater than 10% when the second surface area ratio is 5%.

Figure 26:
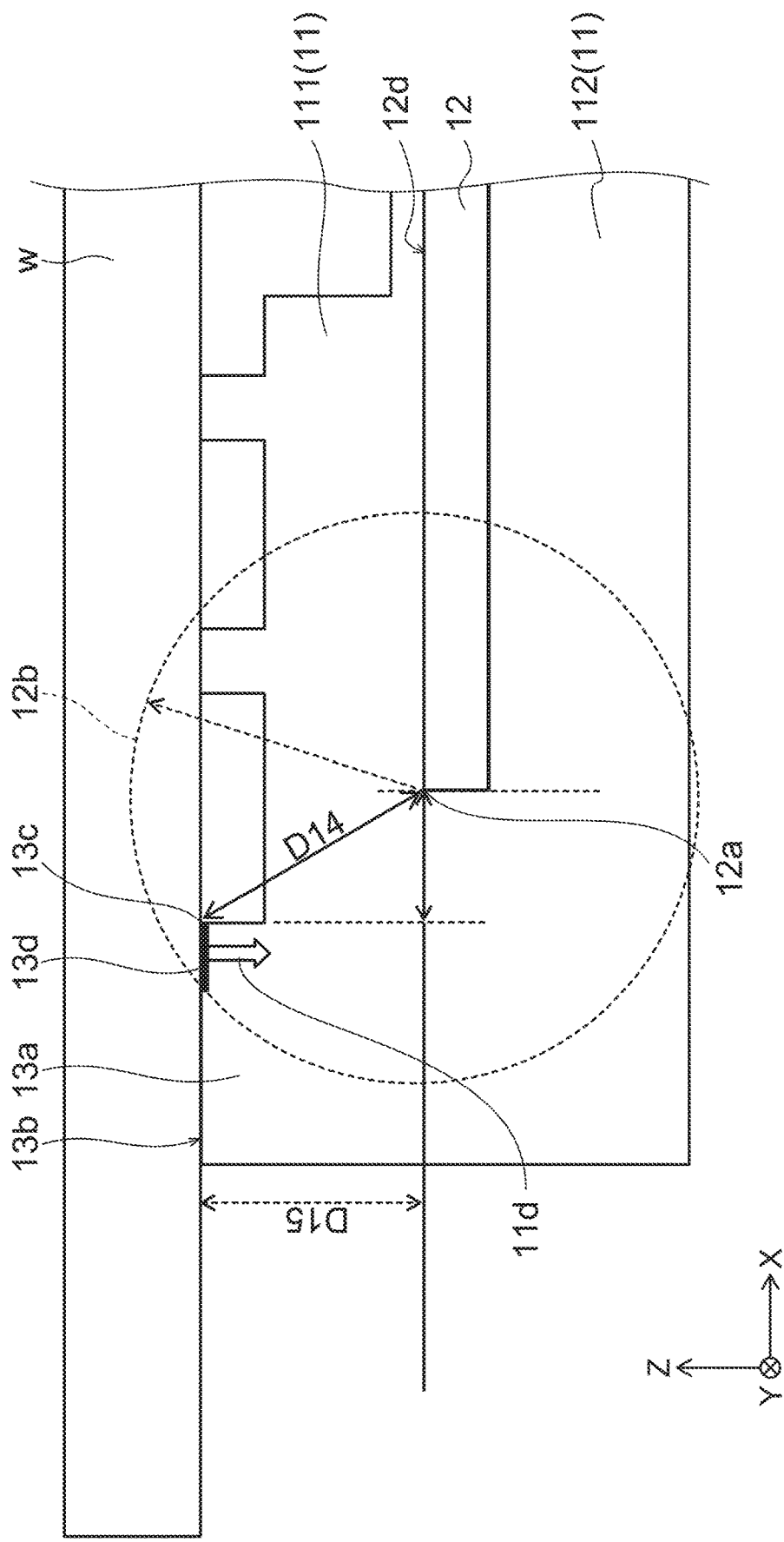
FIG. 26 is a schematic cross-sectional view describing a straight-line distance between the end portion of the sealing ring and the end portion of the electrode layer.

FIG. 26 is a schematic cross-sectional view describing a straight-line distance between the end portion of the sealing ring and the end portion of the electrode layer.

Figure 27:
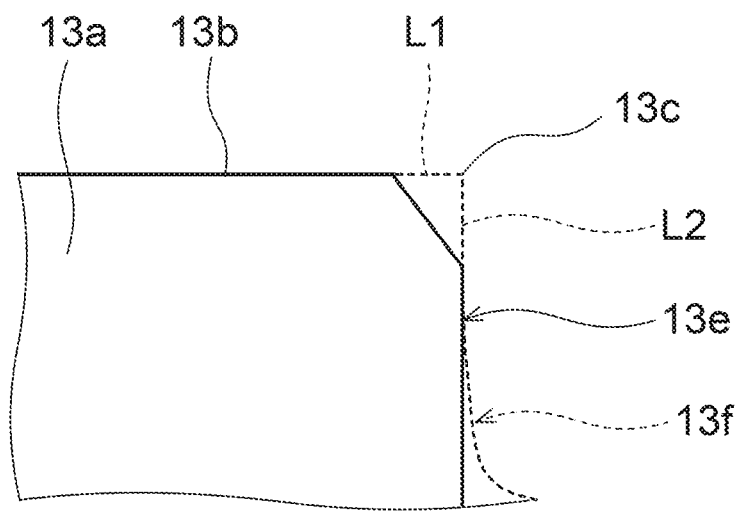
FIG. 27 is a schematic cross-sectional view describing the end portion of the sealing ring of the embodiment.

FIG. 27 is a schematic cross-sectional view describing the end portion of the sealing ring of the embodiment.

Figure 28A:
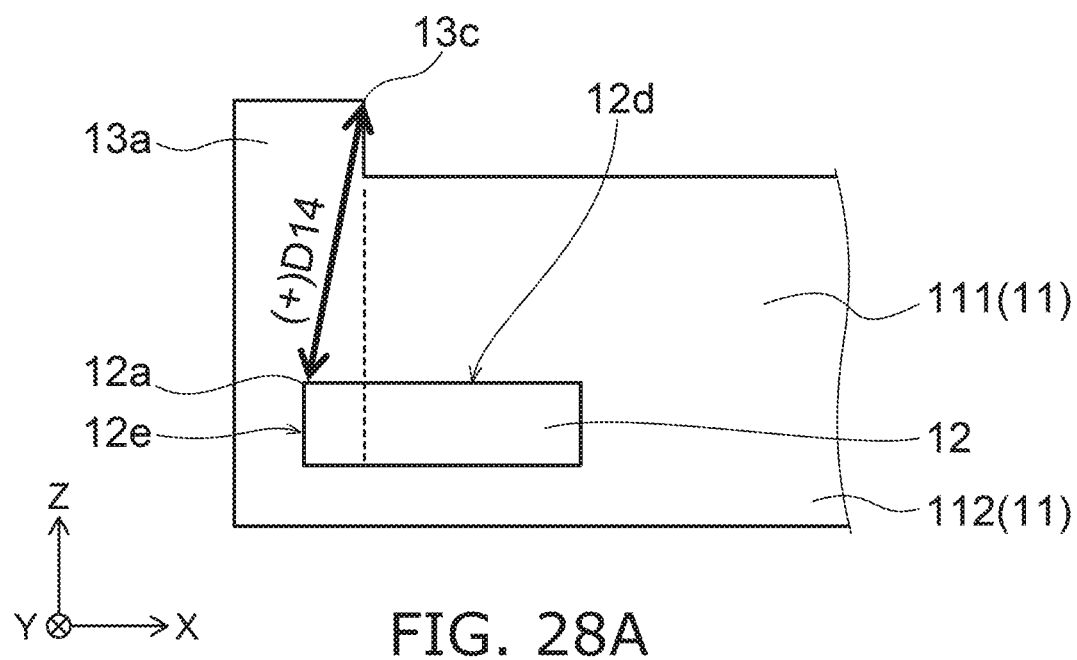
FIGS. 28A and 28B are schematic cross-sectional views describing the signs of the straight-line distance between the end portion of the sealing ring and the end portion of the electrode layer.
Figure 28B:
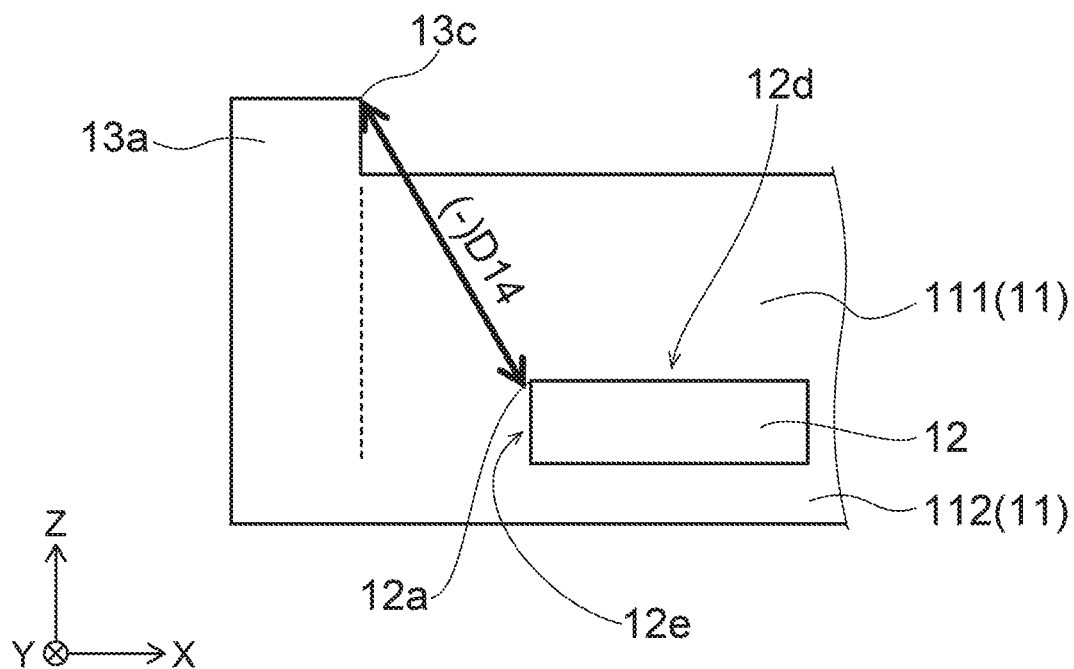

FIGS. 28A and 28B are schematic cross-sectional views describing the signs of the straight-line distance between the end portion of the sealing ring and the end portion of the electrode layer.

FIG. 26, FIG. 28A, and FIG. 28B correspond to enlarged schematic views in which region A1 illustrated in FIG. 1 is enlarged.

FIG. 28A illustrates the case where the sign of the straight-line distance between the end portion of the sealing ring and the end portion of the electrode layer is positive (+). FIG. 28B illustrates the case where the sign of the straight-line distance between the end portion of the sealing ring and the end portion of the electrode layer is negative (−).

As illustrated in FIG. 26, the chucking force that is generated from the outer perimeter portion of the electrode layer 12 spreads over a constant range 12b. In such a case, a chucking force 11d is generated in a constant region 13d of the sealing ring 13a within the range 12b. A thickness D15 of the first dielectric layer 111 corresponds to the distance between the chucking surface (the contact surface) 13b and an interface 12d of the electrode layer 12 and is, for example, not less than 100 micrometers as described above in reference to FIG. 1. The interface 12d is the surface of the electrode layer 12 on the chucking surface (the contact surface) 13b side when viewed from the electrode layer 12.

In the embodiment, the straight-line distance between an end portion 13c on the inner perimeter side of the sealing ring 13a and an end portion 12a on the outer perimeter side of the electrode layer 12 is taken as a distance D14. In the electrostatic chuck 110 according to the embodiment, the distance D14 is not less than −2 millimeters and not more than 2 millimeters. The distance D14 corresponds to the maximum overlap length where the processing object W can be cooled. The distance D14 will now be described further with reference to the drawings.

In the schematic cross-sectional view illustrated in FIG. 27, the end portion 13c on the inner perimeter side of the sealing ring 13a is the crossing point between a line L1 and a line L2, where the line L1 is an extension of the chucking surface (the contact surface) 13b of the sealing ring 13a, and the line L2 is an extension of a side surface 13e formed by sandblasting, etc. Or, the end portion 13c on the inner perimeter side of the sealing ring 13a is the crossing point of the line L1 and the line L2, where the line L1 is an extension of the chucking surface (the contact surface) 13b of the sealing ring 13a, and the line L2 is an extension of a curved surface 13f formed by blasting, etc. Thereby, the end portion 13c on the inner perimeter side of the sealing ring 13a can be defined by considering the presence or absence of a C-surface at the corner portion of the sealing ring 13a, the curvature of the side surface formed by blasting, etc.

In the schematic cross-sectional views illustrated in FIG. 28A and FIG. 28B, the end portion 12a on the outer perimeter side of the electrode layer 12 is the crossing point between the interface 12d of the electrode layer 12 and the normal drawn from an outermost perimeter portion 12e of the electrode layer 12 to the interface 12d of the electrode layer 12. As illustrated in FIG. 28A, the distance D14 on the outer side of the end portion 13c on the inner perimeter side of the sealing ring 13a when viewed in the Z-direction is marked with a positive (+) sign. On the other hand, as illustrated in FIG. 28B, the distance D14 on the inner side of the end portion 13c on the inner perimeter side of the sealing ring 13a when viewed in the Z-direction is marked with a negative (−) sign.

Figure 29:
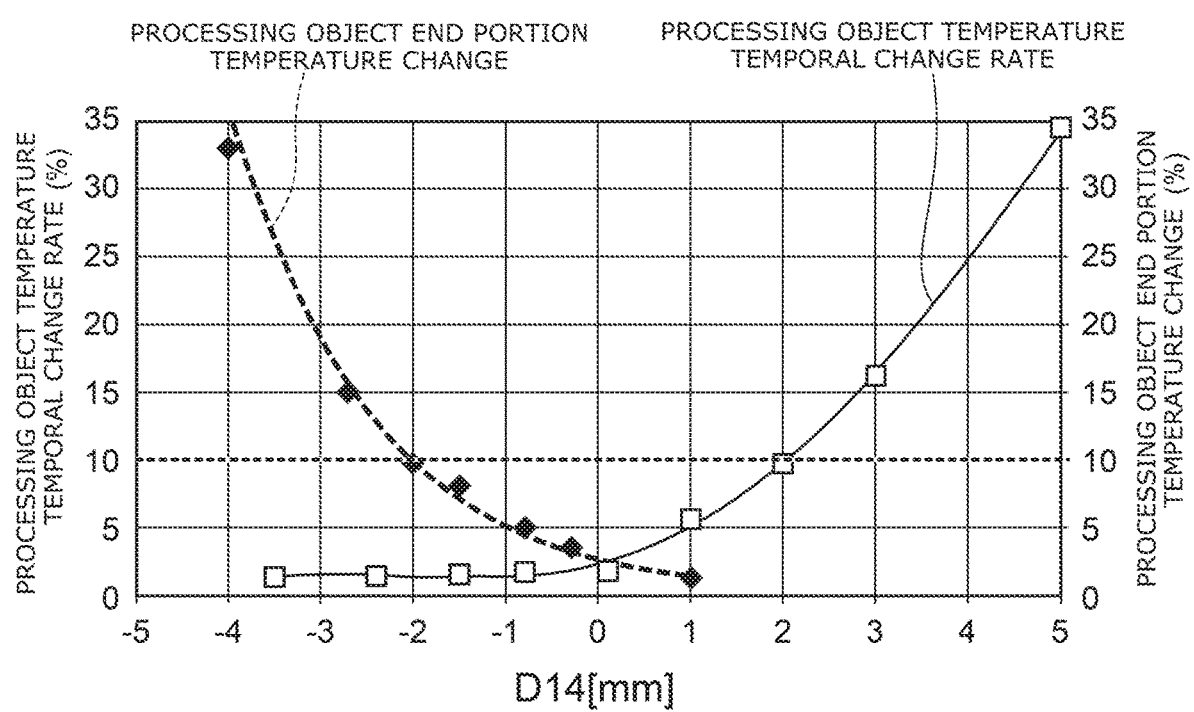
FIG. 29 is a graph illustrating the relationship between the straight-line distance D14 and the temporal change rate of the temperature of the processing object and the relationship between the straight-line distance D14 and the temperature change of the end portion of the processing object.

FIG. 29 is a graph illustrating the relationship between the straight-line distance D14 and the temporal change rate of the temperature of the processing object and the relationship between the straight-line distance D14 and the temperature change of the end portion of the processing object.

The horizontal axis of the graph illustrated in FIG. 29 is the straight-line distance D14 (mm) between the end portion 13c on the inner perimeter side of the sealing ring 13a and the end portion 12a on the outer perimeter side of the electrode layer 12.

The "temporal change rate of the temperature of the processing object W" is as described above in reference to FIG. 22A and FIG. 22B. The "temperature change of the end portion of the processing object W" is as described above in reference to FIG. 22A and FIG. 22B.

As illustrated in FIG. 29, in the case where the sign of the distance D14 is positive (+), the temporal change rate of the temperature of the processing object W increases as the absolute value of the distance D14 increases. On the other hand, in the case where the sign of the distance D14 is negative (−), the temperature change of the end portion of the processing object W increases as the absolute value of the distance D14 increases.

As described above in reference to FIG. 22A and FIG. 22B, the inventor set, as a threshold, the ratio between the average temperature of the central portion of the processing object W and the temperature of the portion Wa of the processing object W to be 10% or less.

Thereby, the distance D14 is not less than −2 millimeters and not more than 2 millimeters.

According to the electrostatic chuck 110 according to the embodiment, the fluctuation of the spacing between the outer perimeter of the electrode layer 12 and the outer perimeter of the ceramic dielectric substrate 11 with respect to the outer diameter of the electrode layer 12 is low. Therefore, a large and constant chucking force 11d can be obtained at the outer perimeter portion of the ceramic dielectric substrate 11 while maintaining the insulation breakdown voltage at the outer perimeter portion of the ceramic dielectric substrate 11. The uniformity of the temperature distribution of the processing object W can be realized. By disposing the electrode layer 12 up to a position proximal to the outer perimeter of the ceramic dielectric substrate 11, the chucking force 11d at the outer perimeter portion of the ceramic dielectric substrate 11 is constant even in the case where the width of the sealing ring 13a is narrow. Thereby, the contact surface area between the processing object W and the ceramic dielectric substrate 11 and the chucking force 11d of the ceramic dielectric substrate 11 are uniform in the circumferential direction; and both the decrease of the temporal change rate of the temperature of the processing object W and the decrease of the temperature change of the end portion of the processing object W can be realized.

Figure 30:
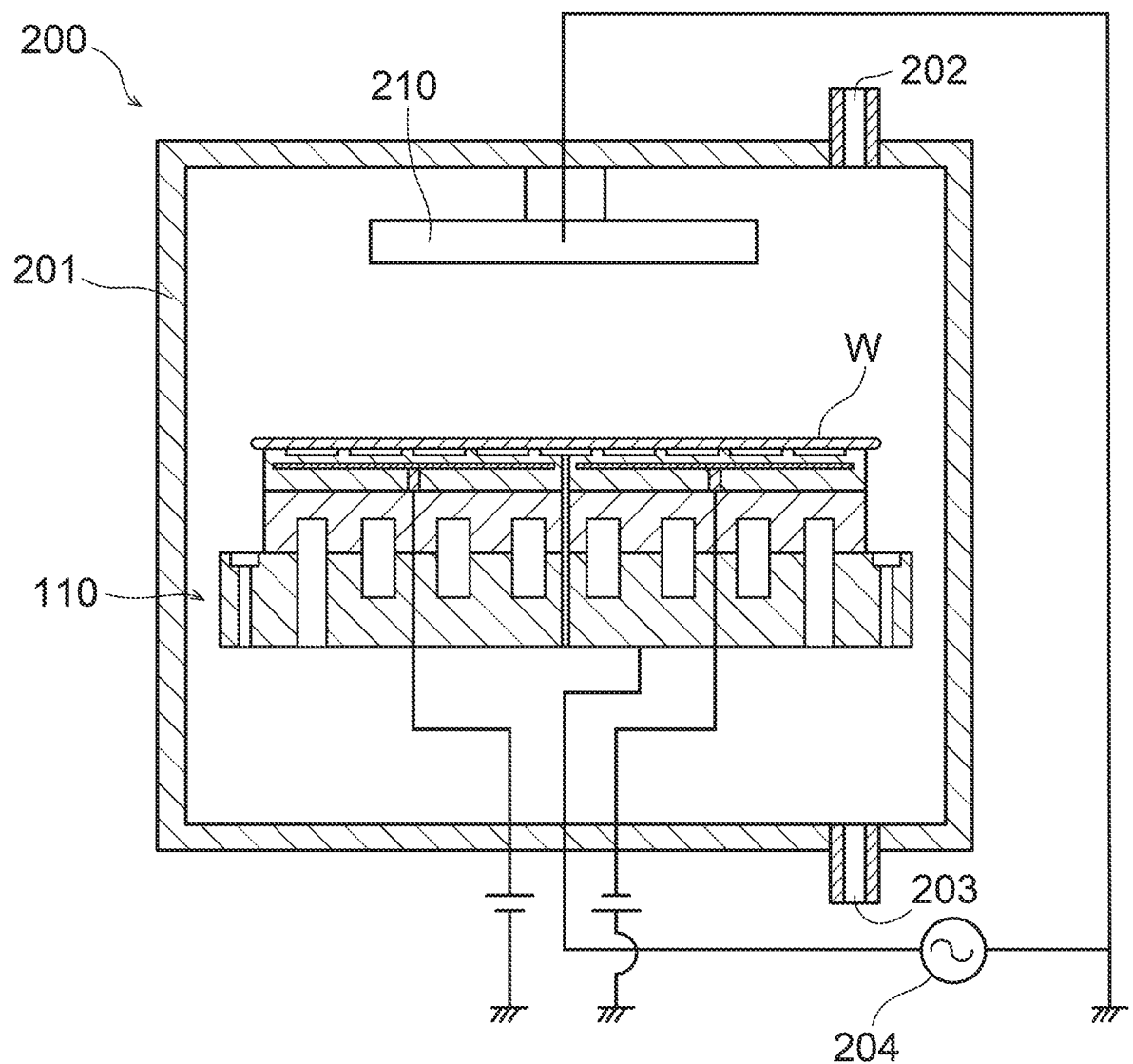
FIG. 30 is a schematic cross-sectional view illustrating a wafer processing apparatus according to another embodiment of the invention.

FIG. 30 is a schematic cross-sectional view illustrating a wafer processing apparatus according to another embodiment of the invention.

The wafer processing apparatus 200 according to the embodiment includes a processing container 201, an upper electrode 210, and the electrostatic chuck 110 described above in reference to FIG. 1 to FIG. 29. A processing gas inlet 202 for introducing a processing gas into the interior is provided in the ceiling of the processing container 201. An exhaust port 203 for evacuating the interior is provided in the bottom plate of the processing container 201. A high frequency power supply 204 is connected to the upper electrode 210 and the electrostatic chuck 110; and a pair of electrodes including the upper electrode 210 and the electrostatic chuck 110 opposes each other to be parallel and separated from each other at a prescribed spacing.

In the wafer processing apparatus 200 according to the embodiment, when a high frequency voltage is applied to the upper electrode 210 and the electrostatic chuck 110, high frequency electric discharge occurs; the processing gas that is introduced to the processing container 201 is excited and activated by plasma; and the processing object W is processed. A semiconductor substrate (a wafer) is an example of the processing object W. However, the processing object W is not limited to a semiconductor substrate (a wafer) and may be, for example, a glass substrate included in a liquid crystal display device, etc.

Although generally an apparatus that has a configuration such as that of the wafer processing apparatus 200 is called a parallel plate-type RIE (Reactive Ion Etching) apparatus, the electrostatic chuck 110 according to the embodiment is not limited to applications in such an apparatus. For example, wide applications are possible in so-called reduced pressure processing apparatuses such as an ECR (Electron Cyclotron Resonance) etching apparatus, an inductively coupled plasma processing apparatus, a helicon wave plasma processing apparatus, a downstream plasma processing apparatus, a surface wave plasma processing apparatus, a plasma CVD (Chemical Vapor Deposition) apparatus, etc. The electrostatic chuck 110 according to the embodiment also is applicable widely to substrate processing apparatuses such as an exposure apparatus or an inspection apparatus in which processing or inspection is performed at atmospheric pressure. However, considering the high plasma resistance of the electrostatic chuck 110 according to the embodiment, it is favorable for the electrostatic chuck 110 to be applied to a plasma processing apparatus. In the configurations of these apparatuses, known configurations are applicable to the portions other than the electrostatic chuck 110 according to the embodiment; and a description is therefore omitted.

According to the wafer processing apparatus 200 according to the embodiment, the in-plane temperature distribution of the wafer (the processing object W) is uniform; and the prescribed processes can be performed without reducing the yield of the wafer (the processing object W).

The embodiment of the invention has been described above. However, the invention is not limited to the above description. Those skilled in the art can suitably modify the above embodiment, and such modifications such as changing the distance between the outer diameter of the dielectric and the outer diameter of the built-in electrode for only several places are also encompassed within the scope of the invention as long as they include the features of the invention. Furthermore, various components in the above embodiment can be combined with each other as long as technically feasible. Such combinations are also encompassed within the scope of the invention as long as they include the features of the invention.

According to an aspect of the present invention, an electrostatic chuck is provided in which the outer perimeter of the electrode is disposed accurately and uniformly up to a position proximal to the outer perimeter of the ceramic dielectric substrate; and while maintaining the insulation breakdown voltage at the outer perimeter portion of the ceramic dielectric substrate, a large and constant chucking force can be obtained at the ceramic dielectric substrate outer perimeter portion; and the temperature distribution of the processing object can be set to be uniform.

What is claimed is:

1. An electrostatic chuck, comprising:
a ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body; and
an electrode layer interposed between the first major surface and the second major surface of the ceramic dielectric substrate, the electrode layer being sintered in the ceramic dielectric substrate as one body,
the electrode layer including a plurality of electrode components arranged to be separated from each other,
an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface,
the spacing between the outer perimeter of the electrode layer and the outer perimeter of the ceramic dielectric substrate being narrower than a spacing of the plurality of electrode components when viewed from the direction,
a width of the sealing ring being not less than 0.3 millimeters and not more than 3 millimeters,
a width where the electrode layer interfaces with the sealing ring being not less than −0.7 millimeters and not more than 2 millimeters when viewed in the direction, where a negative width corresponds to a spacing between the electrode layer and the sealing ring in a state in which the electrode layer is separated from the sealing ring without overlapping the sealing ring when viewed in the direction, and wherein a positive width corresponds to an overlapping of the electrode layer and the sealing ring when viewed in the direction.

2. The chuck according to claim 1, wherein S1/S2 is not less than −3.4% and not more than 5%, where a surface area S1 is a surface area of a region where the electrode layer interfaces with the sealing ring when viewed in the direction, and a surface area S2 is a surface area of the ceramic dielectric substrate when viewed in the direction.

3. The chuck according to claim 1, wherein the spacing between the outer perimeter of the electrode layer and the outer perimeter of the ceramic dielectric substrate is greater than 0 millimeters and not more than 1.95 millimeters.

4. The chuck according to claim 1, wherein LX5/LX6 is not less than 97.4% and not more than 99.6%, where a circumference LX5 is a length of the outer perimeter of the electrode layer, and a circumference LX6 is a length of the outer perimeter of the ceramic dielectric substrate.

5. The chuck according to claim 1, wherein SX5/SX6 is not less than 95.1% and not more than 99.2%, where a surface area SX5 is a surface area of a circle specified by an outer diameter of the outer perimeter of the electrode layer, and a surface area SX6 is a surface area of a circle specified by an outer diameter of the outer perimeter of the ceramic dielectric substrate.

6. The chuck according to claim 1, wherein |X1−X3|/X5 is not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

7. The chuck according to claim 1, wherein ||X1−X2|−|X3−X4|| is not less than 0 micrometers and not more than 200 micrometers, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, and the fourth imaginary line is an imaginary line extending in an outer circumferential direction from the center of the ceramic dielectric substrate and extending on a side opposite to the third imaginary line.

8. The chuck according to claim 1, wherein ||X1−X2|−|X3−X4||/X5 is not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, the fourth imaginary line is an imaginary line extending in an outer circumferential direction from the center of the ceramic dielectric substrate and extending on a side opposite to the third imaginary line, and an outer diameter X5 is an outer diameter of the outer perimeter of the electrode layer.

9. The chuck according to claim 1, wherein |X+X3|/X5 is not less than 0% and not more than 0.15%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

10. The chuck according to claim 1, wherein |X×X3|/X5 is not less than 0% and not more than 15%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, and an outer diameter X5 is an outer diameter of the outer perimeter of the electrode layer.

11. The chuck according to claim 1, wherein |X1−X2|/|X3−X4| is not less than 0 and not more than 200, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line is an imaginary line extending in an outer circumferential direction from the center of the ceramic dielectric substrate and extending on a side opposite to the first imaginary line, a spacing X3 is a spacing between the outer perimeter of the electrode layer and the outer perimeter of the ceramic dielectric substrate on a third imaginary line, the third imaginary line is an imaginary line extending in an outer circumferential direction from the center of the ceramic dielectric substrate and extending in a direction orthogonal to the first imaginary line, a spacing X4 is a spacing between the outer perimeter of the electrode layer and the outer perimeter of the ceramic dielectric substrate on a fourth imaginary line, and the fourth imaginary line is an imaginary line extending in an outer circumferential direction from the center of the ceramic dielectric substrate and extending on a side opposite to the third imaginary line.

12. A wafer processing apparatus, comprising the electrostatic chuck according to claim 1.

13. An electrostatic chuck, comprising:
a ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body; and
an electrode layer interposed between the first major surface and the second major surface of the ceramic dielectric substrate, the electrode layer being sintered in the ceramic dielectric substrate as one body,
an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface,
a mutual error of a spacing between the outer perimeter of the electrode layer and the outer perimeter of the ceramic dielectric substrate on a first imaginary line extending in an outer circumferential direction from a center of the ceramic dielectric substrate being 200 micrometers or less,
a width of the sealing ring being not less than 0.3 millimeters and not more than 3 millimeters,
a width where the electrode layer interfaces with the sealing ring being not less than −0.7 millimeters and not more than 2 millimeters when viewed in the direction, where a negative width corresponds to a spacing between the electrode layer and the sealing ring in a state in which the electrode layer is separated from the sealing ring without overlapping the sealing ring when viewed in the direction, and wherein a positive width corresponds to an overlapping of the electrode layer and the sealing ring when viewed in the direction.

14. An electrostatic chuck, comprising:
a ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body; and
an electrode layer interposed between the first major surface and the second major surface of the ceramic dielectric substrate, the electrode layer being sintered in the ceramic dielectric substrate as one body,
an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface,

|X1−X2|/X5 being not less than 0% and not more than 0.07%, where a spacing X1 is a spacing between the outer perimeter of the electrode layer and the outer perimeter of the ceramic dielectric substrate on a first imaginary line extending in an outer circumferential direction from a center of the ceramic dielectric substrate, a spacing X2 is a spacing between the outer perimeter of the electrode layer and the outer perimeter of the ceramic dielectric substrate on a second imaginary line, the second imaginary line being an imaginary line extending in an outer circumferential direction from the center of the ceramic dielectric substrate and extending on a side opposite to the first imaginary line, and an outer diameter X5 is an outer diameter of the outer perimeter of the electrode layer, a width of the sealing ring being not less than 0.3 millimeters and not more than 3 millimeters, a width where the electrode layer interfaces with the sealing ring being not less than −0.7 millimeters and not more than 2 millimeters when viewed in the direction, where a negative width corresponds to a spacing between the electrode layer and the sealing ring in a state in which the electrode layer is separated from the sealing ring without overlapping the sealing ring when viewed in the direction, and wherein a positive width corresponds to an overlapping of the electrode layer and the sealing ring when viewed in the direction.

15. An electrostatic chuck, comprising:

a ceramic dielectric substrate including a first major surface where a processing object is placed, a second major surface on a side opposite to the first major surface, and a sealing ring, the sealing ring forming a portion of the first major surface and being provided at a peripheral edge portion of the ceramic dielectric substrate, the ceramic dielectric substrate being a polycrystalline ceramic sintered body; and an electrode layer interposed between the first major surface and the second major surface of the ceramic dielectric substrate, the electrode layer being sintered in the ceramic dielectric substrate as one body, an outer perimeter of the ceramic dielectric substrate being provided to cause a spacing between the outer perimeter of the ceramic dielectric substrate and an outer perimeter of the electrode layer to be uniform when viewed from a direction orthogonal to the first major surface, a spacing between the outer perimeter of the electrode layer and the outer perimeter of the ceramic dielectric substrate on a first imaginary line extending in an outer circumferential direction from a center of the ceramic dielectric substrate being 2 millimeters or less, a mutual error of the spacing between the outer perimeter of the electrode layer and the outer perimeter of the ceramic dielectric substrate being 200 micrometers or less, a straight-line distance between an inner perimeter side end portion of the sealing ring and an outer perimeter end portion of the electrode layer being 2 millimeters or less.

* * * * *